United States Patent
Seko

(10) Patent No.: US 8,390,706 B2
(45) Date of Patent: Mar. 5, 2013

(54) SOLID-STATE IMAGING DEVICE WITH IMPURITY DIFFUSION ELEMENT ISOLATION REGION, METHOD FOR MANUFACTURING THE SAME, AND ELECTRONIC APPARATUS INCORPORATING SAME

(75) Inventor: Hiroaki Seko, Kanagawa (JP)

(73) Assignee: Sony Corporation, Tokyo (JP)

( * ) Notice: Subject to any disclaimer, the term of this patent is extended or adjusted under 35 U.S.C. 154(b) by 299 days.

(21) Appl. No.: 12/842,555

(22) Filed: Jul. 23, 2010

(65) Prior Publication Data
US 2011/0025894 A1 Feb. 3, 2011

(30) Foreign Application Priority Data
Jul. 31, 2009 (JP) ................................ 2009-179680

(51) Int. Cl.
*H04N 3/16* (2006.01)
*H04N 9/04* (2006.01)
(52) U.S. Cl. ...................................... 348/294; 348/308
(58) Field of Classification Search .................. 348/294, 348/301, 308
See application file for complete search history.

(56) References Cited

U.S. PATENT DOCUMENTS

| 8,174,599 | B2 * | 5/2012 | Kuroda et al. | 348/301 |
| 2005/0064613 | A1 * | 3/2005 | Takeuchi et al. | 438/24 |
| 2006/0044439 | A1 * | 3/2006 | Hiyama et al. | 348/308 |
| 2010/0289034 | A1 * | 11/2010 | Nakai | 257/84 |

FOREIGN PATENT DOCUMENTS

| JP | 2004-172950 | 6/2004 |
| JP | 2005-347325 | 12/2005 |
| JP | 2006-054276 | 2/2006 |
| JP | 2006-093319 | 4/2006 |
| JP | 2006-157953 | 6/2006 |
| JP | 2006-216577 | 8/2006 |
| JP | 2009-088447 | 4/2009 |

\* cited by examiner

*Primary Examiner* — Gevell Selby
(74) *Attorney, Agent, or Firm* — SNR Denton US LLP

(57) ABSTRACT

A solid-state imaging device includes a plurality of photoelectric conversion portions configured to be formed on the imaging surface of a semiconductor substrate, an element isolation portion in which an impurity diffusion region is formed so as to isolate the plurality of photoelectric conversion portions on the imaging surface, a light shielding portion configured to stop incident light from entering the element isolation portion on the imaging surface, and a plurality of pixel transistors configured to be formed on the imaging surface and to read out and output signal charge, generated in the plurality of photoelectric conversion portions, as data signals, wherein the light shielding portion includes an extending portion extending among the plurality of photoelectric conversion portions and is formed so that the extending portion of the light shielding portion and each of the gate electrodes of the pixel transistor are connected to each other.

14 Claims, 14 Drawing Sheets

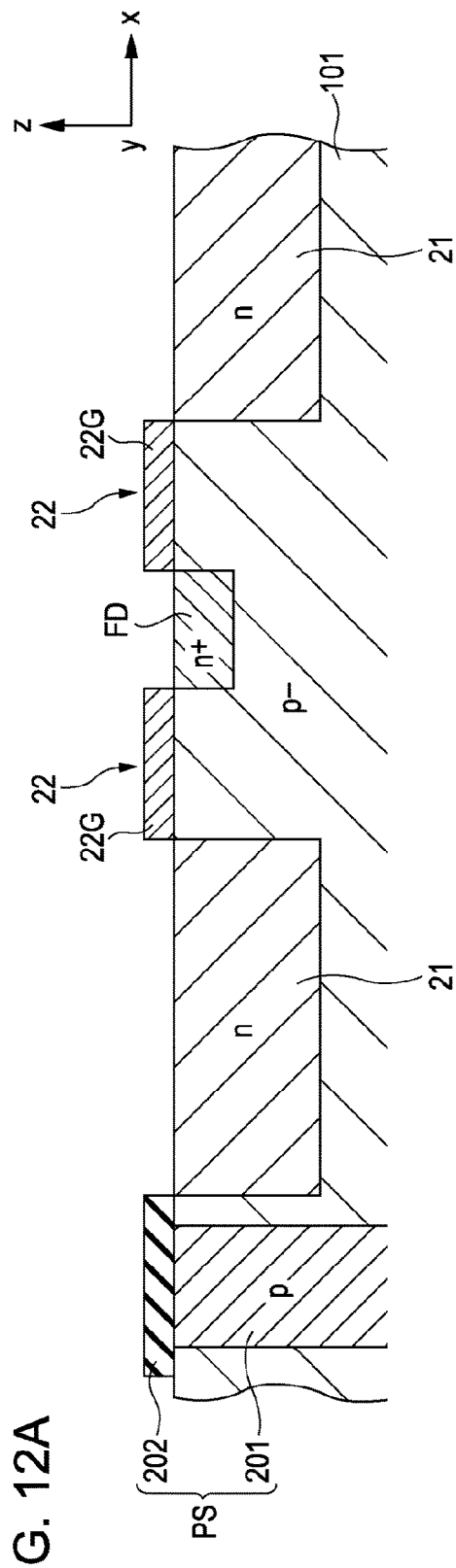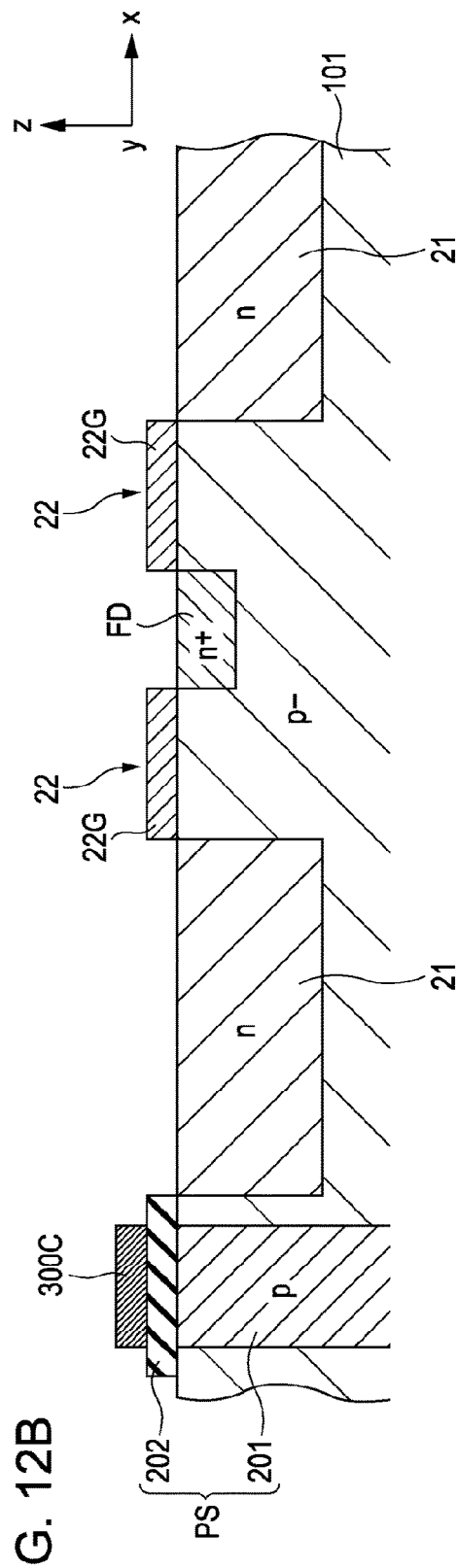

SOLID-STATE IMAGING DEVICE WITH IMPURITY DIFFUSION ELEMENT ISOLATION REGION, METHOD FOR MANUFACTURING THE SAME, AND ELECTRONIC APPARATUS INCORPORATING SAME

BACKGROUND OF THE INVENTION

1. Field of the Invention

The present invention relates to a solid-state imaging device, a method for manufacturing the solid-state imaging device, and an electronic apparatus.

2. Description of the Related Art

Electronic apparatuses such as digital video cameras and digital still cameras include solid-state imaging devices. Examples of the solid-state imaging devices include a complementary metal-oxide semiconductor (CMOS) image sensor and a charge coupled device (CCD) image sensor.

In the solid-state imaging device, an imaging region in which a plurality of pixels are formed is arranged on a semiconductor substrate. In each of the plurality of pixels, a photoelectric conversion portion is arranged. The photoelectric conversion portion is, for example, a photodiode and generates signal charge by receiving incident light on a light-receiving surface, the incident light coming in through an external optical system, and subjecting the received incident light to photoelectric conversion.

In the CMOS image sensor among the solid-state imaging devices, in addition to the photoelectric conversion portion, a pixel is configured to include a plurality of transistors. As pixel transistors, the plurality of transistors are configured to read out and output signal charge generated in the photoelectric conversion portion, to a signal line as an electric signal. For example, four transistors, namely, a transfer transistor, a reset transistor, an amplification transistor, and a selection transistor are arranged as the pixel transistors on the surface of the semiconductor substrate. In addition, wiring lines electrically connected to the plurality of transistors included in the pixel transistors are arranged on the surface of the semiconductor substrate.

In the CMOS image sensor, in order to decrease the size of pixels, it is proposed that pixels are configured so that a plurality of photoelectric conversion portions share the pixel transistors mentioned above. For example, a technique in which two or four photoelectric conversion portions share one pixel transistor group is proposed (for example, refer to Japanese Unexamined Patent Application Publication Nos. 2004-172950, 2006-157953, and 2006-54276).

In addition, a back-illuminated CMOS image sensor in which the back side of the semiconductor substrate is subjected to light, the back side being opposite to the side of the surface of the semiconductor substrate on which wiring lines and pixel transistors are arranged, is proposed (for example, refer to Japanese Unexamined Patent Application Publication No. 2005-347325).

In the example mentioned above, an element isolation portion is arranged on a substrate so as to isolate a plurality of pixels from one another. For example, a shallow trench isolation (STI) region is arranged, as the element isolation portion, on a semiconductor substrate. In addition, an impurity diffusion region is arranged, as the element isolation portion, on the semiconductor substrate. For example, a method, such as an EDI separation method, in which the impurity diffusion region is formed in the semiconductor substrate and a thick insulation layer is further arranged on the impurity diffusion region is proposed (for example, refer to Japanese Unexamined Patent Application Publication Nos. 2005-347325, 2006-93319, and 2006-216577). Japanese Unexamined Patent Application Publication No. 2009-88447 is an example of related art.

SUMMARY OF THE INVENTION

However, when short-wavelength light having high energy enters the impurity diffusion region arranged, as the element isolation portion, on the semiconductor substrate, the image quality of a captured image is sometimes reduced owing to the occurrence of a dark current. This is attributed to a situation in which the short-wavelength light causes Si—H bonding in the region to be broken and hence an interface state increases.

FIG. 14 is a diagram illustrating the relation between the wavelength of the incident light and the occurrence of the dark current.

As shown in FIG. 14, white-defects occur in an image and the occurrence of the dark current increases, with the decreased wavelength of the incident light. In particular, when incident light has a wavelength smaller than or equal to 410 nm, the occurrence of the dark current become pronounced. Therefore, the occurrence of failure such as image-quality loss becomes obvious.

In addition, in the solid-state imaging device, it is necessary to improve manufacturing efficiency and achieve cost reduction.

Therefore, according to an embodiment of the present invention, there are provided a solid-state imaging device, a method for manufacturing the solid-state imaging device, and an electronic apparatus, which are capable of improving the image quality of captured images and fabrication yield.

According to an embodiment of the present invention, a method for manufacturing a solid-state imaging device includes the steps of: forming a plurality of photoelectric conversion portions on the imaging surface of a semiconductor substrate; forming an impurity diffusion region among the plurality of photoelectric conversion portions, the impurity diffusion region functioning as an element isolation portion configured to isolate the plurality of photoelectric conversion portions on the imaging surface; forming a light shielding portion above the element isolation portion, the light shielding portion being configured to stop incident light from entering the element isolation portion on the imaging surface; and forming the gate electrodes of a plurality of pixel transistors on the imaging surface, the plurality of pixel transistors being configured to read out and output signal charge, generated in the plurality of photoelectric conversion portions, as data signals; wherein the method further includes the step of; forming a conductive layer before the light shielding portion forming step and the gate electrode forming step are performed, the conductive layer being formed by forming the layer of a conductive material having a light blocking effect so that a region that includes a portion where the light shielding portion is formed and portions where the gate electrodes of the plurality of pixel transistors are formed is coated on the imaging surface, wherein, in the light shielding portion forming step and the gate electrode forming step, the light shielding portion and the gate electrodes are simultaneously formed by patterning the conductive layer.

According to an embodiment of the present invention, a method for manufacturing a solid-state imaging device includes the steps of: forming a plurality of photoelectric conversion portions on the imaging surface of a semiconductor substrate; forming an impurity diffusion region among the plurality of photoelectric conversion portions, the impurity diffusion region functioning as an element isolation portion configured to isolate the plurality of photoelectric conversion portions on the imaging surface; and forming a light shielding portion above the element isolation portion, the light shielding portion being configured to stop incident light from entering the element isolation portion on the imaging surface; wherein, in the light shielding portion forming step, the light shielding portion is formed so that the light shielding portion includes a portion extending according to the planar shape of the element isolation portion formed on the imaging surface.

According to an embodiment of the present invention, a solid-state imaging device includes: a plurality of photoelectric conversion portions configured to be formed on the imaging surface of a semiconductor substrate; an element isolation portion in which an impurity diffusion region is formed so as to isolate the plurality of photoelectric conversion portions on the imaging surface; a light shielding portion configured to stop incident light from entering the element isolation portion on the imaging surface; and a plurality of pixel transistors configured to be formed on the imaging surface and to read out and output signal charge, generated in the plurality of photoelectric conversion portions, as data signals; wherein the light shielding portion includes an extending portion extending among the a plurality of photoelectric conversion portions and is formed so that the extending portion of the light shielding portion and each of the gate electrodes of the pixel transistor are connected to each other.

According to an embodiment of the present invention, an electronic apparatus includes: a plurality of photoelectric conversion portions configured to be formed on the imaging surface of a semiconductor substrate; an element isolation portion in which an impurity diffusion region is formed so as to isolate the plurality of photoelectric conversion portions on the imaging surface; a light shielding portion configured to stop incident light from entering the element isolation portion on the imaging surface; and a plurality of pixel transistors configured to be formed on the imaging surface and to read out and output signal charge, generated in the plurality of photoelectric conversion portions, as data signals; wherein the light shielding portion includes an extending portion extending among the a plurality of photoelectric conversion portions and is formed so that the extending portion of the light shielding portion and each of the gate electrodes of the pixel transistor are connected to each other.

According to an embodiment of the present invention, a conductive layer is formed before a process for forming a light shielding portion and the gate electrode of a pixel transistor is performed, the conductive layer being formed by forming the layer of a conductive material having a light blocking effect so that a region that includes a region where the light shielding portion is formed and a region where the gate electrode of the pixel transistor is formed is coated. In addition, the light shielding portion and the individual gate electrode are simultaneously formed by patterning the conductive layer.

BRIEF DESCRIPTION OF THE DRAWINGS

FIGS. 12A and 12B are diagrams illustrating main parts arranged in individual processes in a method for manufacturing the solid-state imaging device according to the third embodiment of the present invention;

DESCRIPTION OF THE PREFERRED EMBODIMENTS

Hereinafter, preferred embodiments of the present invention will be described in detail with reference to figures.

In addition, the embodiments will be described in the following order:

1. First Embodiment (a case in which a light shielding portion and a gate electrode are integrally formed in the same layer)

2. Second Embodiment (a case in which a light shielding portion and a gate electrode are separately formed in the same layer)

3. Third Embodiment (a case in which a light shielding portion and a gate electrode are formed in layers different from each other, respectively)

4. Other Issues

1. First Embodiment (A) Device Configuration
(A-1) Configuration of Main Part of Camera FIG. 1 is a configuration diagram illustrating a configuration of a camera 40 according to a first embodiment of the present invention.

Figure 1:
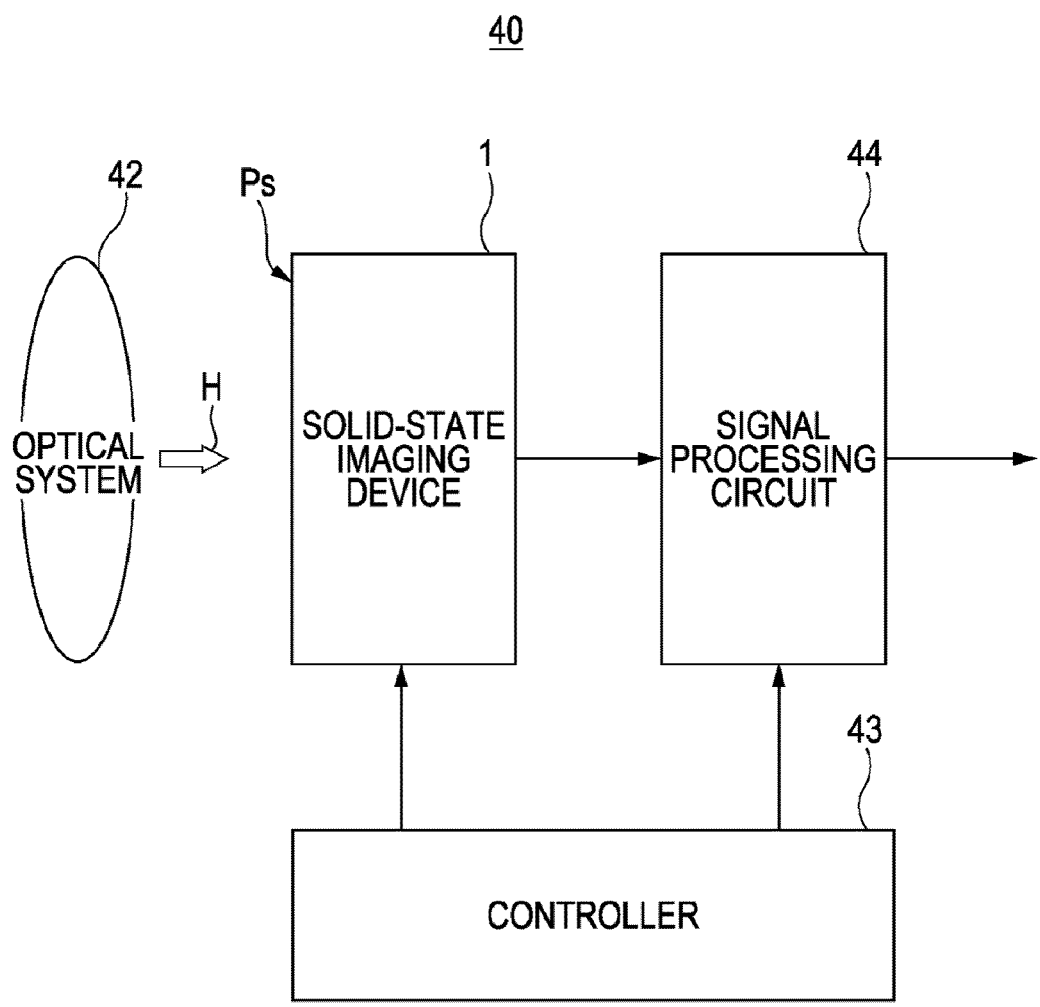
FIG. 1 is a configuration diagram illustrating a configuration of a camera according to a first embodiment of the present invention.

As shown in FIG. 1, the camera 40 includes a solid-state imaging device 1, an optical system 42, a control section 43, and a signal processing section 44. The individual parts will be described sequentially.

The solid-state imaging device 1 generates signal charge by receiving incident light H (object image) on an imaging surface Ps, the incident light coming in through the optical system 42, and subjecting the received incident light to photoelectric conversion. Here, the solid-state imaging device 1 performs driving on the basis of a control signal output from the control section 43. Specifically, the solid-state imaging device 1 reads out and outputs the signal charge as raw data.

The optical system 42 includes optical elements such as an imaging lens and an aperture stop and is arranged to focus the incident light H due to an object image onto the imaging surface Ps of the solid-state imaging device 1.

The control section 43 outputs various kinds of control signals to the solid-state imaging device 1 and the signal processing section 44 and controls the solid-state imaging device 1 and the signal processing section 44 to perform driving.

The signal processing section 44 is configured so that a digital image corresponding to the object image is generated by subjecting the raw data output from the solid-state imaging device 1 to signal processing.

(A-2) Configuration of Main Part of Solid-State Imaging Device

The total configuration of the solid-state imaging device 1 will be described.

Figure 2:
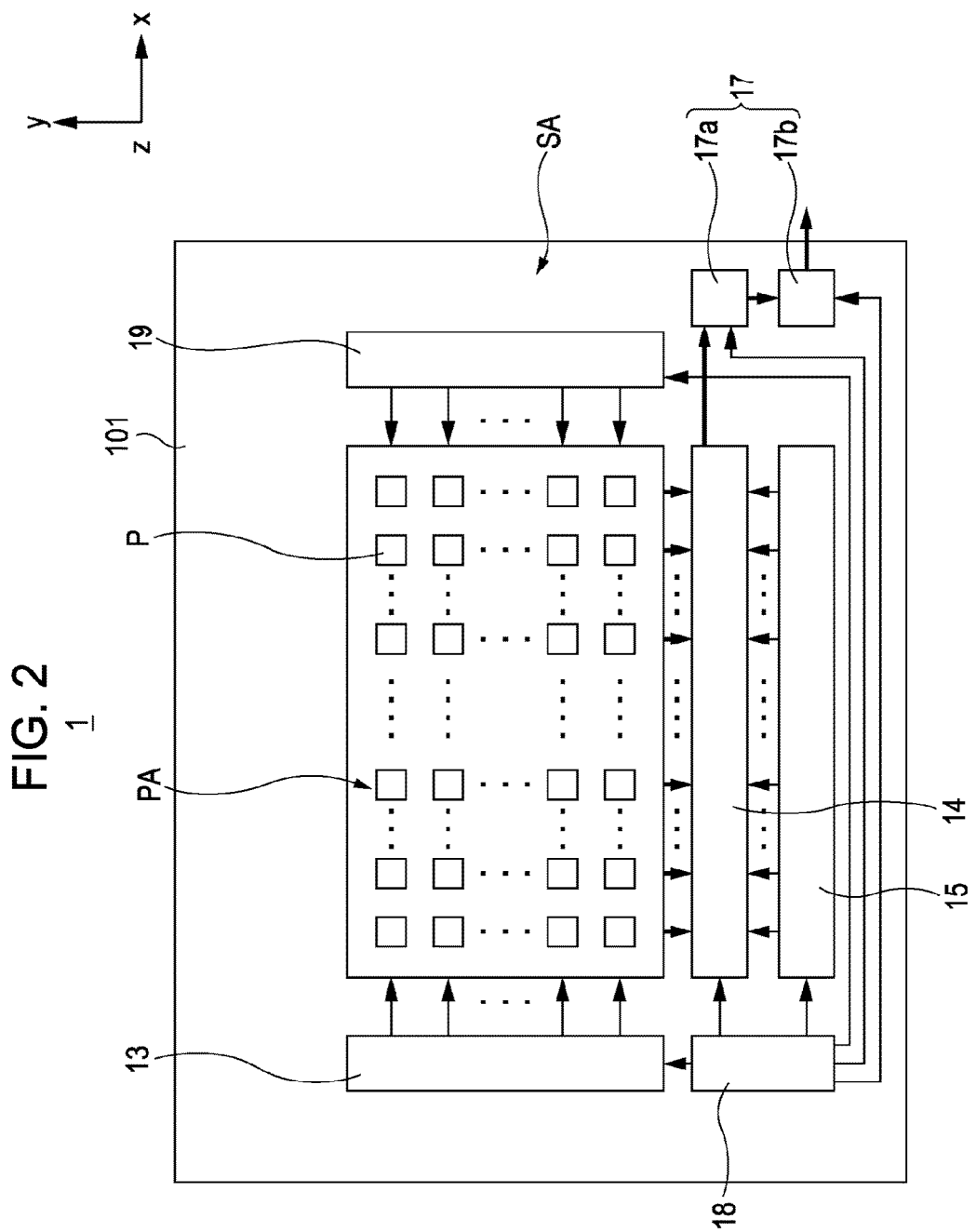
FIG. 2 is a diagram illustrating a total configuration of a solid-state imaging device according to the first embodiment of the present invention.

FIG. 2 is a diagram illustrating the total configuration of the solid-state imaging device 1 according to the first embodiment of the present invention.

As shown in FIG. 2, the solid-state imaging device 1 according to the first embodiment includes a substrate 101. The substrate 101 is a semiconductor substrate made of, for example, silicon, and, as shown in FIG. 2, an imaging region PA and a peripheral region SA are arranged on the surface of the substrate 101.

As shown in FIG. 2, the imaging region PA has rectangular geometry and a plurality of pixels P are arranged in a horizontal direction x and a vertical direction y in the imaging region PA. Namely, the pixels P are arranged in a matrix. In addition, the imaging region PA is arranged so that the center of the imaging region PA corresponds to the optical axis of the optical system 42 shown in FIG. 1. In addition, the imaging region PA corresponds to the imaging surface Ps shown in FIG. 1.

The pixel P receives incident light on the imaging region PA and generates signal charge. Then, the generated signal charge is read out and output by a pixel transistor. Namely, the solid-state imaging device 1 according to the embodiment is a CMOS image sensor where pixels P are area-arrayed. The detailed configuration of each of the pixels P will be described hereinafter.

The peripheral region SA is located around the imaging region PA, as shown FIG. 2. In addition, a peripheral circuit is arranged in the peripheral region SA.

Specifically, as shown in FIG. 2, a vertical driving circuit 13, a column circuit 14, a horizontal driving circuit 15, an external output circuit 17, a timing generator (TG) 18, and a shutter driving circuit 19 are arranged as peripheral circuits.

As shown in FIG. 2, the vertical driving circuit 13 is arranged in the peripheral region SA at the side of the imaging region PA and configured so as to select and cause, in units of rows, the pixels P in the imaging region PA to be driven.

As shown in FIG. 2, the column circuit 14 is arranged in the peripheral region SA at the lower side of the imaging region PA and configured so as to subject signals output from the pixels P in units of columns to signal processing. Here, the column circuit 14 includes a correlated double sampling (CDS) circuit (not shown) and performs signal processing to remove fixed pattern noise.

As shown in FIG. 2, the horizontal driving circuit 15 is electrically connected to the column circuit 14. The horizontal driving circuit 15 includes, for example, a shift register and sequentially outputs the signals, which are held in the column circuit 14 in units of the columns of the pixels P, to the external output circuit 17.

As shown in FIG. 2, the external output circuit 17 is electrically connected to the column circuit 14, subjects the signals output from the column circuit 14 to signal processing, and, after that, outputs the signals externally. The external output circuit 17 includes an automatic gain control (AGC) circuit 17a and an ADC circuit 17b. In the external output circuit 17, after the AGC circuit 17a multiplies the signals by a gain factor, the ADC circuit 17b converts the signals from analog signals to digital signals and outputs the digital signals externally.

As shown in FIG. 2, the timing generator 18 is electrically connected to the vertical driving circuit 13, the column circuit 14, the horizontal driving circuit 15, the external output circuit 17, and the shutter driving circuit 19. The timing generator 18 generates and outputs various kinds of timing signals to the vertical driving circuit 13, the column circuit 14, the horizontal driving circuit 15, the external output circuit 17, and the shutter driving circuit 19, and thereby performs drive control on each of the circuits.

The shutter driving circuit 19 is configured so as to select the pixels P in units of rows and adjust the exposure times of the pixels P.

(A-3) Detailed Configuration of Solid-State Imaging Device

The detailed configuration of the solid-state imaging device 1 according to the embodiment will be described.

FIGS. 3 to 6 are diagrams illustrating main parts of the solid-state imaging device 1 according to the first embodiment of the present invention.

Figure 3:
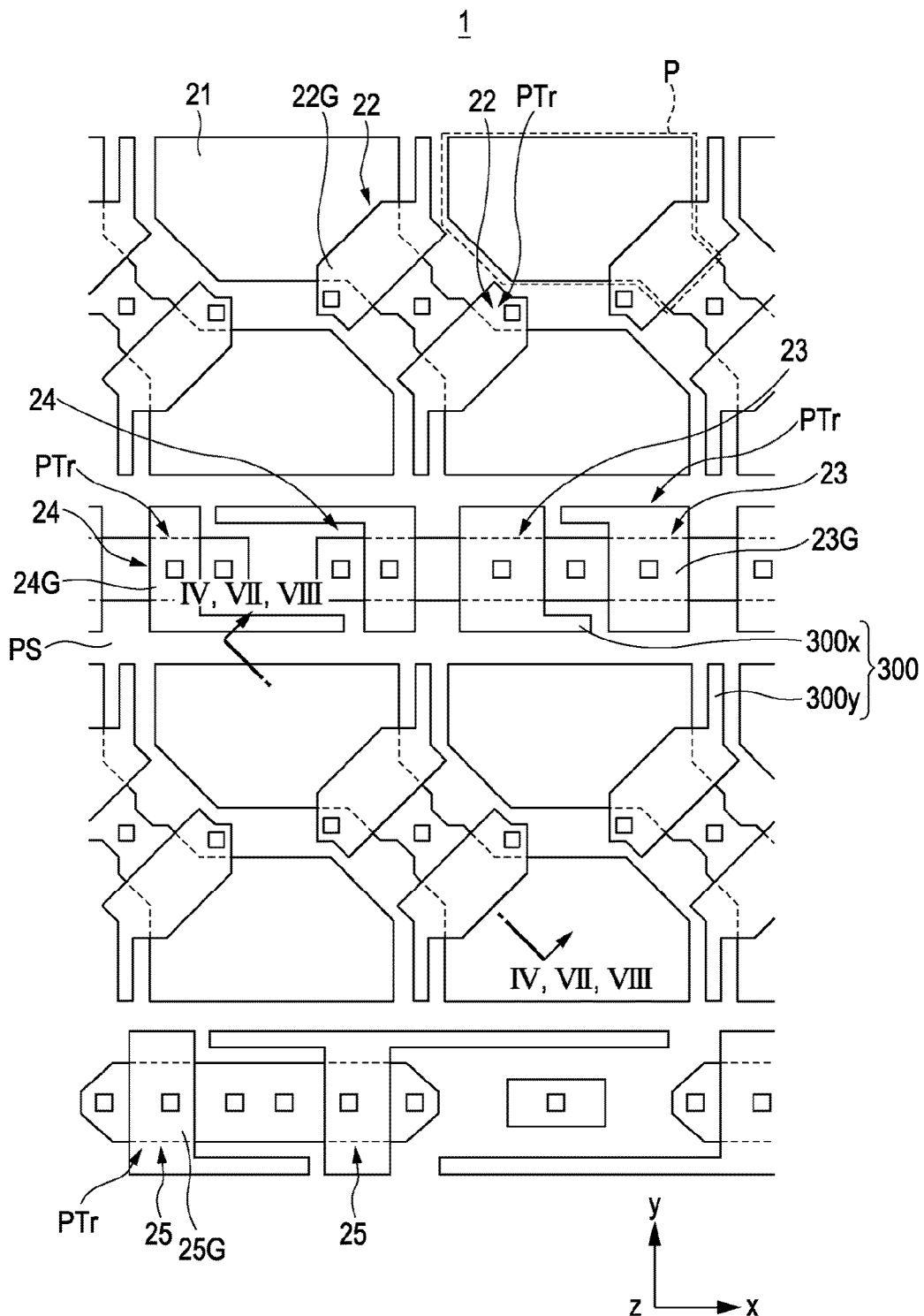
FIG. 3 is a diagram illustrating a main part of the solid-state imaging device according to the first embodiment of the present invention.
Figure 4:
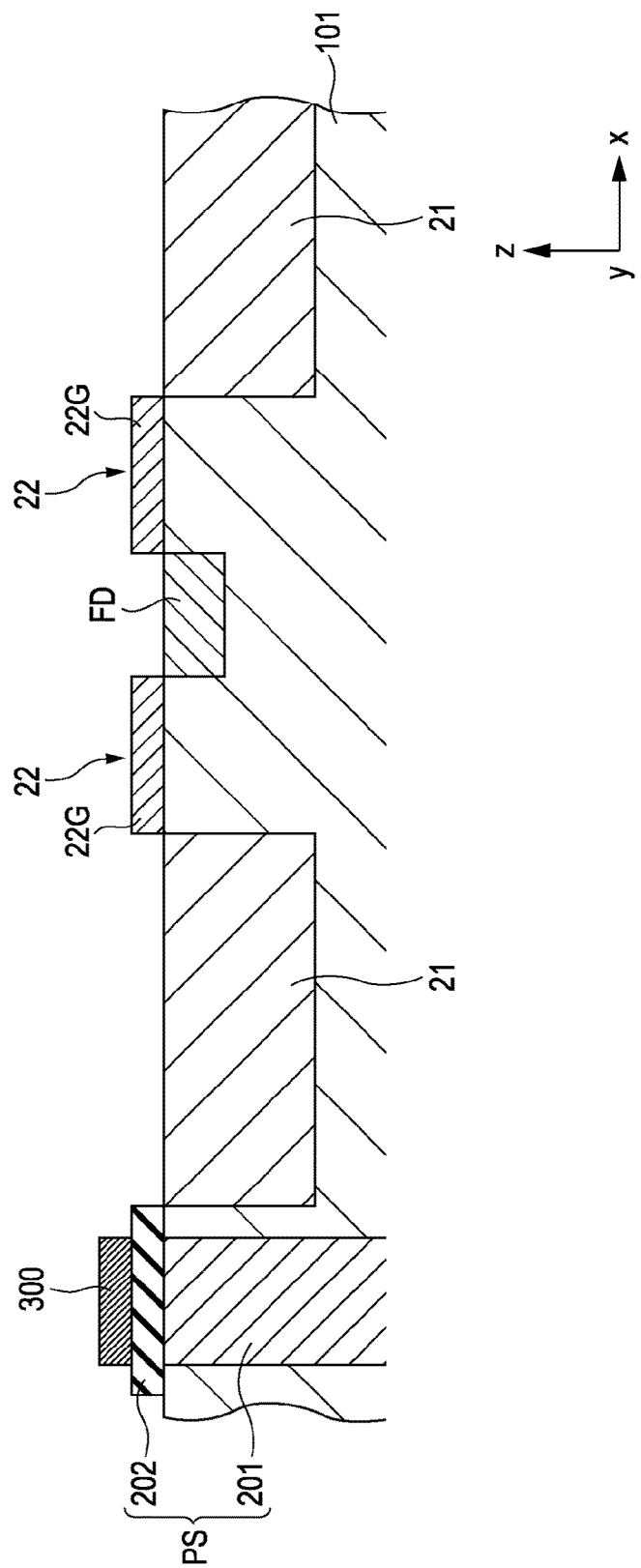
FIG. 4 is a diagram illustrating a main part of the solid-state imaging device according to the first embodiment of the present invention.
Figure 5:
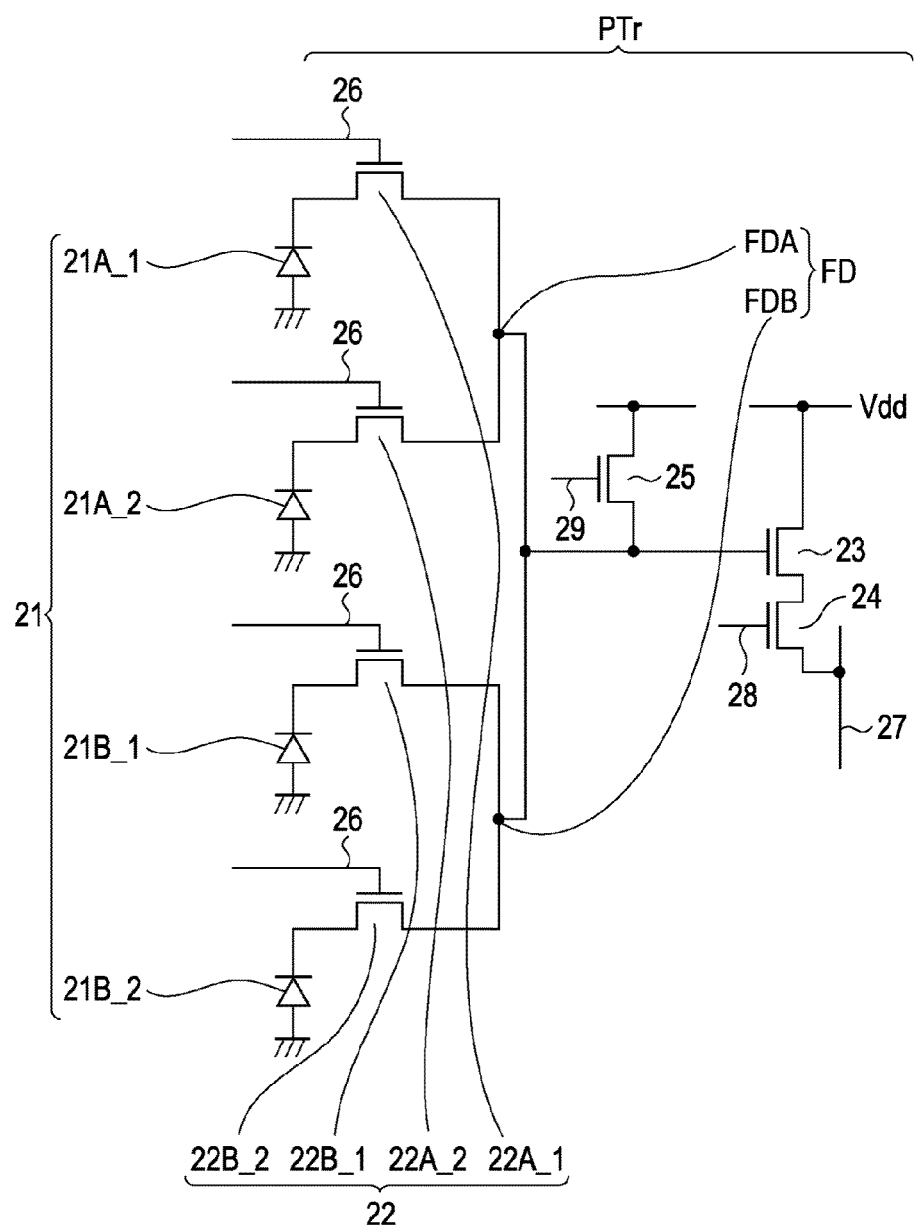
FIG. 5 is a diagram illustrating a main part of the solid-state imaging device according to the first embodiment of the present invention.
Figure 6:
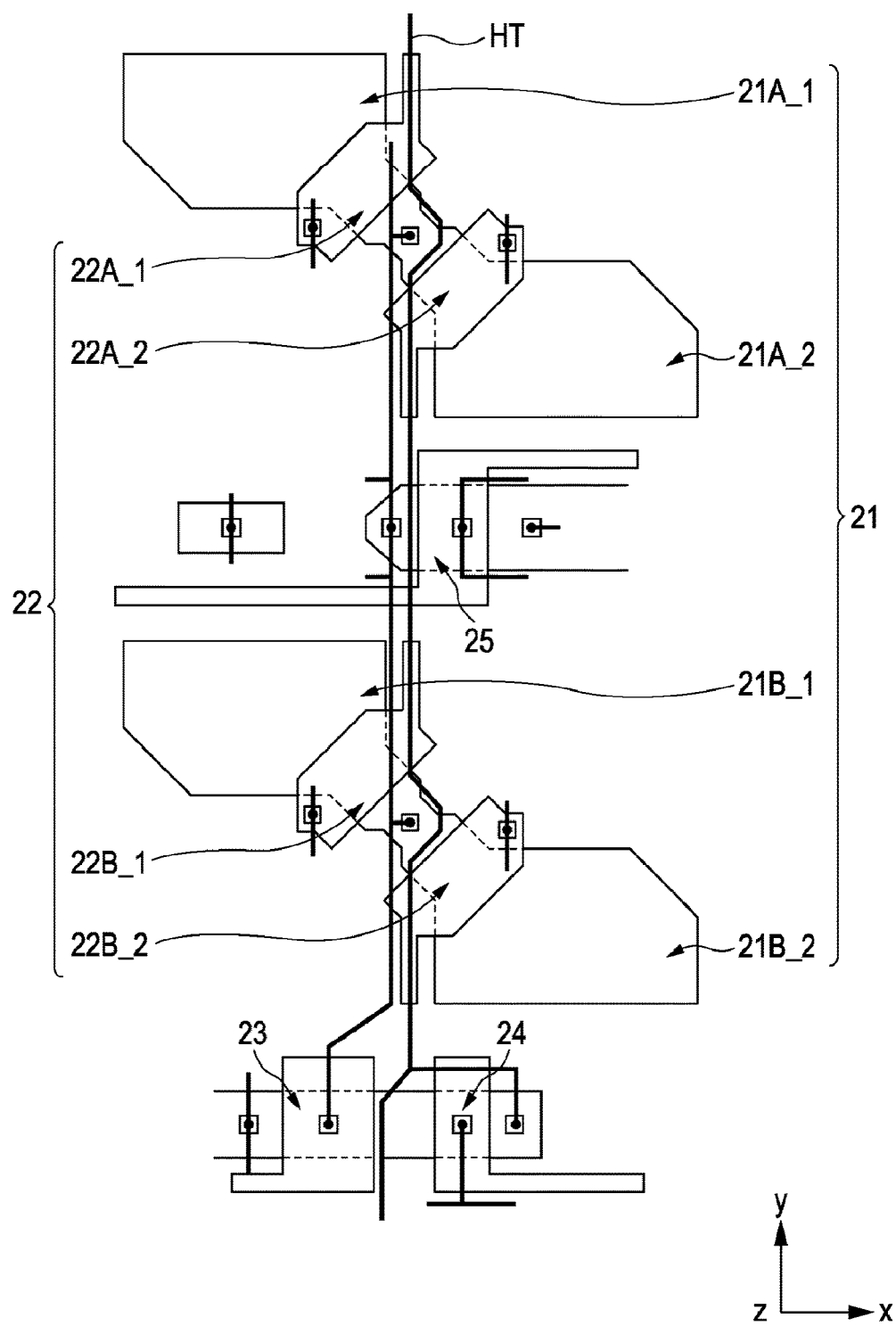
FIG. 6 is a diagram illustrating a main part of the solid-state imaging device according to the first embodiment of the present invention.

Here, FIG. 3 illustrates the upper surface of the imaging region PA. FIG. 4 illustrates the cross-section of the imaging region PA. FIG. 4 illustrates the cross-section taken along IV-IV shown in FIG. 3. In addition, FIG. 5 illustrates the circuit configuration of the pixel P arranged in the imaging region PA. FIG. 6 illustrates the shared unit with respect to a plurality of pixels P.

As shown in FIGS. 3, 4, and 5, the solid-state imaging device 1 includes a photodiode 21, a pixel transistor PTr, an element isolation portion PS, and a light shielding portion 300. Here, as shown in FIGS. 3 and 5, the pixel transistor PTr is configured so as to include a transfer transistor 22, an amplification transistor 23, a selection transistor 24, and a reset transistor 25 and read out signal charge from the photodiode 21.

Individual portions included in the solid-state imaging device will be described sequentially.

(A-3-1) Photodiode 21

In the solid-state imaging device 1, a plurality of the photodiodes 21 are arranged on an imaging surface (xy surface), as shown in FIG. 3. The plurality of photodiodes 21 are arranged so as to be evenly spaced apart in both a horizontal direction x and a vertical direction y perpendicular to the horizontal direction x so as to correspond to the array of a plurality of the pixels P. Here, each of the photodiodes 21 is arranged in each of regions into which the imaging surface (xy surface) is compartmented by the element isolation portion PS.

In addition, as shown in FIG. 4, the photodiode 21 is arranged in the substrate 101. The photodiode 21 is configured so as to receive incident light (object image) and subject the incident light to photoelectric conversion, thereby generating and accumulating signal charge.

For example, the photodiode 21 is configured by forming an n-type charge accumulation region (not shown) in a p-well (not shown) arranged in the substrate 101 that is an n-type silicon semiconductor. In addition, furthermore, in order to suppress a dark current, the photodiode 21 is configured so as to include a p-type accumulation layer (not shown) on the surface of the substrate 101. Namely, the photodiode 21 is formed using a so-called hole accumulated diode (HAD) structure.

In addition, as shown in FIG. 5, each of the photodiodes 21 is configured so that signal charge accumulated in the photodiode 21 is transferred to a floating diffusion region FD by the transfer transistor 22.

In the embodiment, as shown in FIGS. 3 and 4, the transfer transistor 22 is arranged adjacent to each of the photodiodes 21. In addition, the photodiodes 21 are arranged so that one floating diffusion region FD is located between a pair of the photodiodes 21. Here, the photodiodes 21 are arranged so that one floating diffusion region FD is located between a pair of the photodiodes 21 arranged in an oblique direction with respect to both the horizontal direction x and the vertical direction y.

In addition, as shown in FIG. 5, four photodiodes 21 are configured so as to share one group including one amplification transistor 23, one selection transistor 24, and one reset transistor 25.

Specifically, as shown in FIG. 5, four transfer transistors 22 (22A_1, 22A_2, 22B_1, and 22B_2) are arranged in combination so as to correspond to the four photodiodes 21 (21A_1, 21A_2, 21B_1, and 21B_2), respectively.

In addition, as shown in FIG. 5, for example, a pair of photodiodes 21 (21A_1 and 21A_2, or 21B_1 and 21B_2) are arranged for one floating diffusion region FD (FDA or FDB). In addition, as shown in FIG. 5, one amplification transistor 23, one selection transistor 24, and one reset transistor 25 are arranged for four photodiodes 21 (21A_1, 21A_2, 21B_1, and 21B_2).

For example, as shown in FIG. 6, two pairs of the photodiodes 21 (a pair of 21A_1 and 21A_2 and a pair of 21B_1 and 21B_2), the photodiodes of each of the two pairs being arranged in an oblique direction, are arranged in the vertical direction y, and the four photodiodes 21 share the individual elements 23, 24, and 25. In addition, wiring lines HT are arranged so as to extend among the individual photodiodes 21 and electrically connect individual portions.

(A-3-2) Pixel Transistor PTr

In the solid-state imaging device 1, as shown in FIG. 3, the pixel transistor PTr is formed in the element isolation portion PS compartmenting a plurality of pixels P, in the imaging surface (xy surface). The pixel transistor PTr includes a transfer transistor 22, an amplification transistor 23, a selection transistor 24, and a reset transistor 25, and is configured so as to read out and output signal charge, generated in the photodiode 21, as a data signal.

Each of the transfer transistor 22, the amplification transistor 23, the selection transistor 24, and the reset transistor 25 is configured as, for example, an N-channel MOS transistor.

Here, each of gate electrodes 22G, 23G, 24G, and 25G is formed using, for example, polysilicon. In addition to the example mentioned above, each of the gate electrodes 22G, 23G, 24G, and 25G may be suitably formed using any one of silicide, polycide, and salicide.

In addition, the activation regions of the individual transistors 22, 23, 24, and 25 are formed in the element isolation portion PS of the substrate 101.

The details of the individual transistors 22, 23, 24, and 25 will be described hereinafter.

In the pixel transistor PTr, as shown in FIG. 3, a plurality of the transfer transistors 22 are formed so as to correspond to a plurality of pixels P. Here, the individual transfer transistors 22 are formed so that the floating diffusion region FD, which is arranged among a plurality of pixels P arranged in an oblique direction with respect to both the horizontal direction x and the vertical direction y on the imaging surface (xy surface), is located between a pair of the transfer transistors 22.

In addition, as shown in FIGS. 3 and 4, the gate electrode (transfer gate) 22G of the transfer transistor 22 is arranged on the surface of the substrate 101 through a gate insulation layer (not shown). As shown in FIG. 4, the gate electrode 22G of the transfer transistor 22 is arranged so as to be adjacent to the floating diffusion region FD arranged on the surface of the substrate 101. Here, a pair of the gate electrodes 22G are formed so that one floating diffusion region FD is located between the pair of the gate electrodes 22G.

Here, as shown in FIG. 5, the transfer transistor 22 is configured so as to output signal charge, generated in the photodiode 21, to the gate of the amplification transistor 23 as an electric signal.

In the embodiment, as shown in FIG. 5, one terminal of each of the plurality of transfer transistors 22 is electrically connected to the cathode of each photodiode 21. In addition, the other terminal of each of the plurality of transfer transistors 22 is electrically connected to one floating diffusion region FD. Specifically, one pair of transfer transistors (22A_1 and 22A_2) is electrically connected to one floating diffusion region FDA. In addition, the other pair of transfer transistors (22B_1 and 22B_2) is electrically connected to the other floating diffusion region FDB. In addition, when a transfer signal is supplied to the gate of each of the plurality of transfer transistors 22 from a transfer line 26, the transfer transistor 22 sequentially transfers signal charge, accumulated in the photodiode 21, to the floating diffusion region FD as an output signal.

In the pixel transistor PTr, as shown in FIG. 3, the amplification transistor 23 is arranged among a plurality of photodiodes 21 arranged in the vertical direction y. Here, the amplification transistor 23 is arranged so that a channel is located between a pair of a source and a drain in a horizontal direction. In addition, the amplification transistors 23 are arranged so that two amplification transistors 23 are adjacent to each other in the horizontal direction x.

As shown in FIG. 5, the amplification transistor 23 is configured so as to amplify and output the electric signal output from the transfer transistor 22.

Specifically, as shown in FIG. 5, the gate of the amplification transistor 23 is connected to the floating diffusion region FD. In addition, the drain of the amplification transistor 23 is connected to a power-source electrical potential supply line Vdd and the source of the amplification transistor 23 is connected to the selection transistor 24. When the selection transistor 24 is selected to be in an on-state, the amplification transistor 23 is supplied with a constant current from a constant current source (not shown) and functions as a source follower. Therefore, since a selection signal is supplied to the selection transistor 24, an output signal output from the floating diffusion region FD is amplified in the amplification transistor 23.

In the pixel transistor PTr, as shown in FIG. 3, the selection transistor 24 is arranged among a plurality of photodiodes 21 arranged in the vertical direction y. Here, the selection transistor 24 is arranged so that a channel is located between a pair of a source and a drain in the horizontal direction. In addition, the selection transistors 24 are arranged so that, in positions where the amplification transistors 23 are arranged in the vertical direction y, two selection transistors 24 are arranged in the horizontal direction x. Specifically, two selection transistors 24 arranged in the horizontal direction x are formed so that two amplification transistors 23 arranged in the horizontal direction x are located between the two selection transistors 24.

As shown in FIG. 5, the selection transistor 24 is configured so as to output an electric signal output from the amplification transistor 23 to a vertical signal line 27 when the selection signal is input to the selection transistor 24.

Specifically, as shown in FIG. 5, the gate of the selection transistor 24 is connected to an address line 28 to which the selection signal is supplied. When the selection signal is supplied to the selection transistor 24, the selection transistor 24 turns into an on-state and outputs the output signal amplified as mentioned above in the amplification transistor 23 to the vertical signal line 27.

As shown in FIG. 3, in the pixel transistor PTr, the reset transistors 25 are arranged among a plurality of photodiodes 21 arranged in the vertical direction y. Here, the reset transistor 25 is arranged so that a channel is located between a pair of a source and a drain in the horizontal direction. In addition, the reset transistors 25 are arranged so that, in positions different from the positions where the amplification transistors 23 and the selection transistors 24 are arranged in the vertical direction y, two reset transistors 25 are arranged adjacent to each other in the horizontal direction x.

As shown in FIG. 5, the reset transistor 25 is configured so as to reset the gate electrical potential of the amplification transistor 23.

Specifically, as shown in FIG. 5, the gate of the reset transistor 25 is connected to a reset line 29 to which a reset signal is supplied. In addition, the drain of the reset transistor 25 is connected to the power-source electrical potential supply line Vdd and the source of the reset transistor 25 is connected to the floating diffusion region FD. In addition, when the reset signal is supplied to the gate of the reset transistor 25 from the reset line 29, the reset transistor 25 resets the gate electrical potential of the amplification transistor 23 to the power-source electrical potential through the floating diffusion region FD.

In the embodiment, as shown in FIGS. 5 and 6, the amplification transistor 23, the selection transistor 24, and the reset transistor 25, mentioned above, are configured to be shared by a group including a plurality of photodiodes 21. For example, as shown in FIGS. 5 and 6, one amplification transistor 23, one selection transistor 24, and one reset transistor 25 are arranged for a group including four photodiodes 21 (21A_1, 21A_2, 21B_1, and 21B_2).

(A-3-3) Element Isolation Portion PS

As shown in FIG. 3, in the solid-state imaging device 1, the element isolation portion PS is interposed between a plurality of pixels P arranged in the horizontal direction x and between a plurality of pixels P arranged in the vertical direction y, and is configured so as to isolate individual pixels P.

Here, as shown in FIG. 4, the element isolation portion PS includes an impurity diffusion region 201 and an insulation layer 202, and isolates the photodiodes 21 of individual pixels P from one another. Namely, the element isolation portion PS is formed according to an EDI method.

Specifically, as shown in FIG. 4, in the element isolation portion PS, the impurity diffusion region 201 is formed in a depth direction from the surface of the substrate 101. For example, the impurity diffusion region 201 is formed by further ion-implanting p-type impurity into a p-type semiconductor region arranged in the substrate 101 that is a silicon semiconductor.

In addition, as shown in FIG. 4, in the element isolation portion PS, the insulation layer 202 is formed above the impurity diffusion region 201. Here, the insulation layer 202 is formed so as to be larger in width than the impurity diffusion region 201 in cross-section. For example, the insulation layer 202 is formed using a silicon dioxide layer so that the layer thickness of the insulation layer 202 becomes 100 nm.

(A-3-4) Light Shielding Portion 300

As shown in FIG. 3, in the solid-state imaging device 1, the light shielding portion 300 is formed, using a light shielding material, above the element isolation portion PS so as to stop incident light from entering the element isolation portion PS. Here, as shown in FIG. 4, the light shielding portion 300 is arranged above the element isolation portion PS.

Specifically, as shown in FIG. 4, the light shielding portion 300 is directly formed so as to be in contact with the upper surface of the insulation layer 202 included in the element isolation portion PS. For example, the light shielding portion 300 is formed using polysilicon in the same way as the individual gate electrodes 22G, 23G, 24G, and 25G. In addition to the example mentioned above, the light shielding portion 300 may be suitably formed using a light-absorptive material, such as silicide, polycide, or salicide, in the same way as the individual gate electrodes 22G, 23G, 24G, and 25G.

In the embodiment, as shown in FIG. 3, the light shielding portion 300 includes a portion 300x extending in the horizontal direction x and a portion 300y extending in the vertical direction y.

In the light shielding portion 300, as shown in FIG. 3, a plurality of the portions 300x extending in the horizontal direction x are formed so as to correspond to portions extending longer in the horizontal direction x than in the vertical direction y in the element isolation portion PS. Here, the portions 300x extending in the horizontal direction x are arranged among a plurality of photodiodes 21 arranged in the vertical direction y. In addition, the portions 300x are arranged among the gate electrodes 23G of a plurality of amplification transistors 23. In addition, the extending portions 300x are arranged among the gate electrodes 24G of a plurality of selection transistors 24. In addition, the extending portions 300x are arranged among the gate electrodes 25G of a plurality of reset transistors 25.

In addition, in the light shielding portion 300, as shown in FIG. 3, a plurality of the portions 300y extending in the vertical direction y are formed so as to correspond to portions extending longer in the vertical direction y than in the horizontal direction x in the element isolation portion PS. Here, the portions 300y extending in the vertical direction y are arranged among a plurality of photodiodes 21 arranged in the horizontal direction x.

The extending portions 300x and 300y are, for example, polysilicon, and formed in the same layer as the individual gate electrodes 22G, 23G, 24G, and 25G, as shown in FIG. 3. Namely, while details will be described hereinafter, the extending portions 300x and 300y are formed by subjecting a conductive layer to a patterning process, the conductive layer being formed so as to coat regions including the individual electrodes 22G, 23G, 24G, and 25G and the light shielding portion 300.

In addition, the extending portions 300x and 300y are formed so as to be integrated with the individual gate electrodes 22G, 23G, 24G, and 25G. Namely, the extending portions 300x and 300y are formed so as to be connected to the individual gate electrodes 22G, 23G, 24G, and 25G.

(A-3-5) Other Issues

In addition, while not shown in FIG. 4, a wiring layer (not shown) is arranged on the surface of the substrate 101. In the wiring layer, wiring lines (not shown) electrically connected to individual elements are formed in multiple layers in an interlayer-insulation layer (not shown).

The wiring lines are formed so as to function as wiring lines used for the transfer line 26, the address line 28, the vertical signal line 27, and the reset line 29 as shown in FIG. 5. As shown in FIG. 6, the wiring lines HT in the wiring layer (not shown) are formed using a metallic material, and are arranged, for example, so as to extend among a plurality of photodiodes 21. In addition, individual wiring lines HT are arranged, for example, so as to be symmetrical with respect to the photodiodes 21 arranged in the horizontal direction x, and electrically connect individual portions, as mentioned above.

In addition, in the substrate 101, optical elements, such as on-chip lenses (not shown) and color filters (not shown) or the like, are arranged so as to correspond to the pixels P. For example, when an image sensor is a back-illuminated image sensor where incident light comes in from the back side of the substrate 101, optical elements, such as on-chip lenses and color filters or the like, are arranged on the back side of the substrate 101. Therefore, the solid-state imaging device 1 is configured so that the photodiodes 21 receive incident light coming in through optical elements, such as on-chip lenses and color filters or the like, sequentially.

(B) Manufacturing Method

The main part of a manufacturing method for manufacturing the solid-state imaging device 1 will be described hereinafter.

Figure 7:
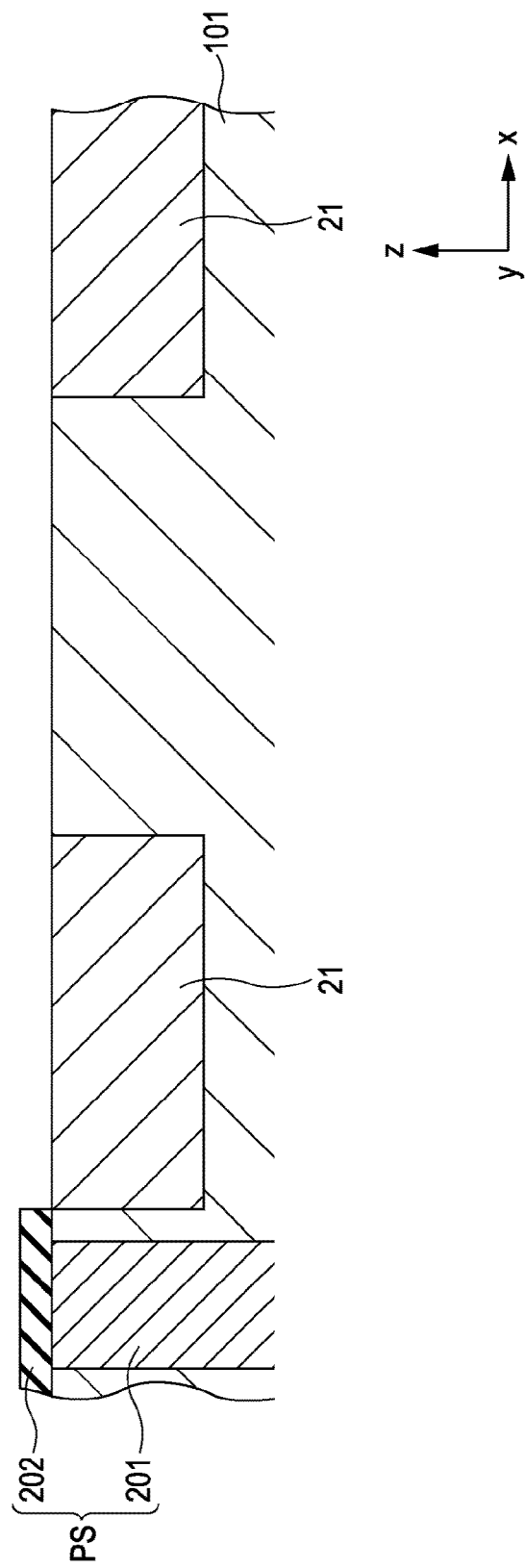
FIG. 7 is a diagram illustrating main parts arranged in individual processes in a method for manufacturing the solid-state imaging device according to the first embodiment of the present invention.
Figure 8:
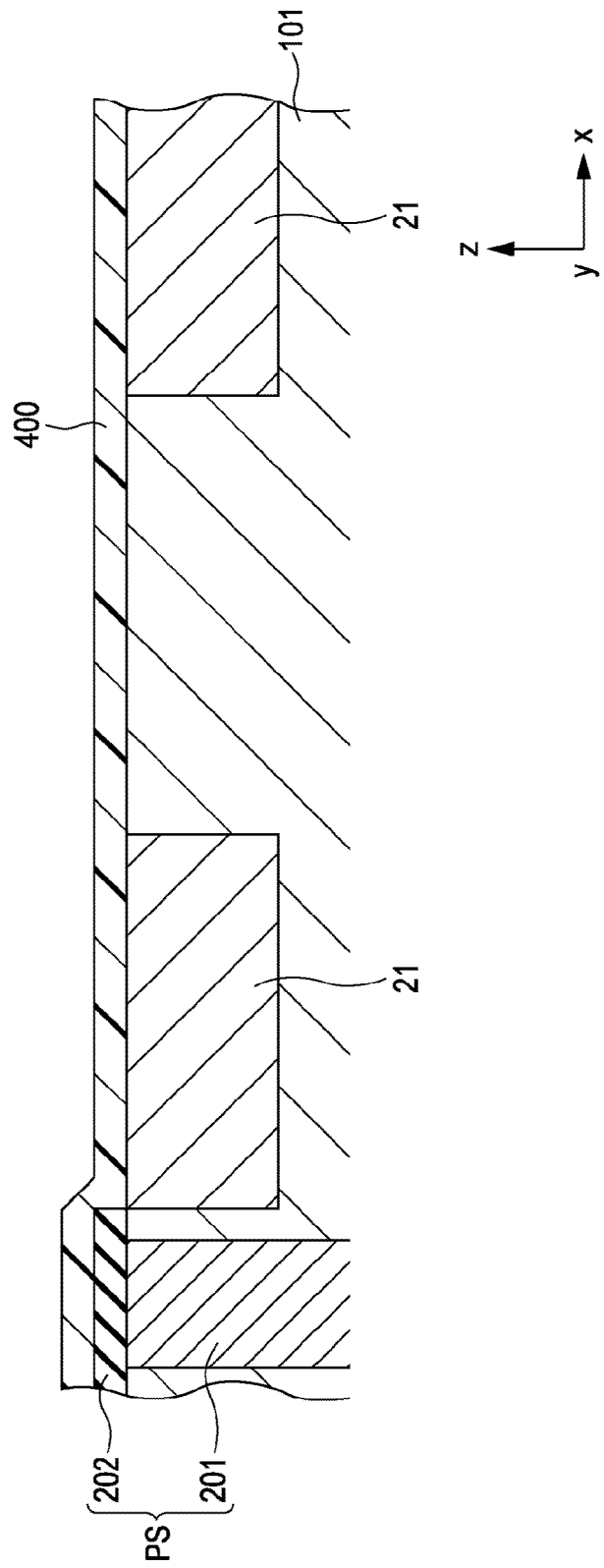
FIG. 8 is a diagram illustrating main parts arranged in individual processes in a method for manufacturing the solid-state imaging device according to the first embodiment of the present invention.

FIGS. 7 and 8 are diagrams illustrating main parts arranged in individual processes in the method for manufacturing the solid-state imaging device 1 according to the first embodiment of the present invention. Here, FIGS. 7 and 8 illustrate the cross-section of the imaging region PA in the same way as FIG. 4.

(B-1) Formation of Element Isolation Portion PS and Photodiode 21

As shown in FIG. 7, first, the element isolation portion PS and the photodiodes 21 are formed.

Here, as shown in FIG. 7, the element isolation portion PS is formed so as to include the impurity diffusion region 201 and the insulation layer 202.

As shown in FIG. 7, the impurity diffusion region 201 is formed so as to extend in a depth direction from the surface of the substrate 101. Specifically, p-type impurity is ion-implanted into a portion where the impurity diffusion region 201 is formed in a p-well (p−) arranged in the substrate 101 that is an n-type silicon semiconductor. For example, as the impurity diffusion region 201, a p-type diffusion region (p) is formed, into which p-type impurity (boron or the like) is ion-implanted at a dose amount of $1*10^{11}$ to $1*10^{14}$ cm$^{-2}$ so that the impurity concentration of the p-type diffusion region (p) is larger than that of the p-well (p−).

In addition, as shown in FIG. 7, the insulation layer 202 is formed so as to be located above the impurity diffusion region 201. Here, the insulation layer 202 is formed so as to be larger in width than the impurity diffusion region 201 in cross-section. For example, the insulation layer 202 is formed using Si oxide.

In addition, the photodiodes 21 are formed by arranging n-type charge accumulation regions in a p-well (not shown) arranged in the substrate 101 that is an n-type silicon semiconductor. For example, the n-type charge accumulation region is arranged by performing ion implantation at a dose amount of $1*10^{12}$ cm$^{-2}$. In addition, furthermore, a highly-concentrated p-type accumulation layer (not shown) is formed on the surface of the substrate 101. For example, the highly-concentrated p-type accumulation layer is formed so that the concentration thereof becomes $5*10^{17}$ cm$^{-3}$.

In addition, channel forming regions of the individual pixel transistors PTr are appropriately ion-implanted to adjust a threshold value. In addition, by subjecting the surface of the substrate 101 to thermal oxidation processing, a silicon dioxide layer (not shown) is formed, as a gate insulation layer, in a region including portions where the pixel transistors PTr are formed.

(B-2) Formation of Polysilicon Layer 400

Next, as shown in FIG. 8, a polysilicon layer 400 is formed.

Here, as shown in FIG. 8, on the surface of the substrate 101, the polysilicon layer 400 is formed so as to coat a region including portions where the gate electrodes of the individual pixel transistors PTr (22G or the like; refer to FIGS. 3 and 4) and the light shielding portion 300 (refer to FIGS. 3 and 4) are formed.

(B-3) Formation of Gate Electrode (22G etc.) and Light Shielding Portion 300 etc.

Next, as shown in FIGS. 3 and 4, individual portions, such as the gate electrodes (22G or the like) and the light shielding portion 300 or the like, are formed.

Here, as shown in FIG. 4, by patterning the polysilicon layer 400 shown in FIG. 8, the gate electrodes (22G or the like) and the light shielding portion 300 are formed. For example, after a resist pattern (not shown) is formed on the polysilicon layer 400 using a photolithographic technique, the patterning process mentioned above is performed by subjecting the polysilicon layer 400 to an etching process using the resist pattern as a mask.

As shown in FIG. 3, a plurality of the individual gate electrodes 22G, 23G, 24G, and 25G are formed.

In addition, as shown in FIG. 3, a plurality of the light shielding portions 300 are formed.

Specifically, as shown in FIG. 3, the light shielding portion 300 is formed so as to include the portion 300x extending in the horizontal direction x and the portion 300y extending in the vertical direction y. For example, the portion 300y extending in the vertical direction y is formed, as the light shielding portion 300, so as to be connected to the gate electrode 22G of the transfer transistor 22. In addition, the portion 300x extending in the horizontal direction x is formed, as the light shielding portion 300, so as to be connected to the gate electrode 23G of the amplification transistor 23. In addition, the portion 300x extending in the horizontal direction x is formed, as the light shielding portion 300, so as to be connected to the gate electrode 24G of the selection transistor 24. In addition, the portion 300x extending in the horizontal direction x is formed, as the light shielding portion 300, so as to be connected to the gate electrode 25G of the reset transistor 25.

As shown in FIG. 4, these light shielding portions 300 are formed on the upper surface of the insulation layer 202 included in the element isolation portion PS.

In addition, the source and drain regions of the individual pixel transistors PTr (floating diffusion regions FDs are included) are formed. Specifically, the source and drain regions of the individual pixel transistor PTr are formed by ion-implanting n-type impurity to the substrate 101. In this way, the pixel transistors PTr are arranged.

Specifically, as shown in FIG. 3, a plurality of the transfer transistors 22 of the pixel transistors PTr mentioned above are formed so as to correspond to the plurality of pixels P, respectively. Here, as shown in FIG. 3, the individual transfer transistors 22 are formed so that the floating diffusion region FD, which is arranged among a plurality of pixels P arranged in an oblique direction with respect to both the horizontal direction x and the vertical direction y and from which signal charge is read out, is located between a plurality of gates 22G.

In addition, as shown in FIGS. 4 and 5, a plurality of the amplification transistors 23, the selection transistors 24, and the reset transistors 25 are formed so that a plurality of pixels P share one of the amplification transistors 23, one of the selection transistors 24, and one of the reset transistors 25.

After that, portions, such as a wiring layer (not shown) and on-chip lenses or the like, are formed and hence the solid-state imaging device 1 is completed.

(C) Summary

As mentioned above, according to the embodiment, before a process for forming the light shielding portion 300 and the gate electrodes 22G, 23G, 24G, and 25G of the pixel transistors PTr is performed, the layer of a conductive material having a light blocking effect (polysilicon) is formed so that a region that includes a region where the light shielding portion is formed and regions where the gate electrodes of the pixel transistors are formed is coated. Accordingly, the polysilicon layer 400 is formed. In addition, by patterning the polysilicon layer 400, the light shielding portion 300 and the individual gate electrodes 22G, 23G, 24G, and 25G are simultaneously formed. Here, the light shielding portion 300 and the individual gate electrodes 22G, 23G, 24G, and 25G are formed so that the light shielding portion 300 and each of the individual gate electrodes 22G, 23G, 24G, and 25G are connected to each other.

In this way, in the embodiment, since the light shielding portion 300 is formed using a material used for the gate electrodes 22G, 23G, 24G, and 25G, the increasing number of processes can be prevented and manufacturing efficiency can be improved.

In addition, in the embodiment, the light shielding portion 300 is directly arranged on the upper surface of the insulation layer 202 included in the element isolation portion PS. Therefore, incident light entering the impurity diffusion region 201 in the element isolation portion PS can be stopped effectively.

Figure 9A:
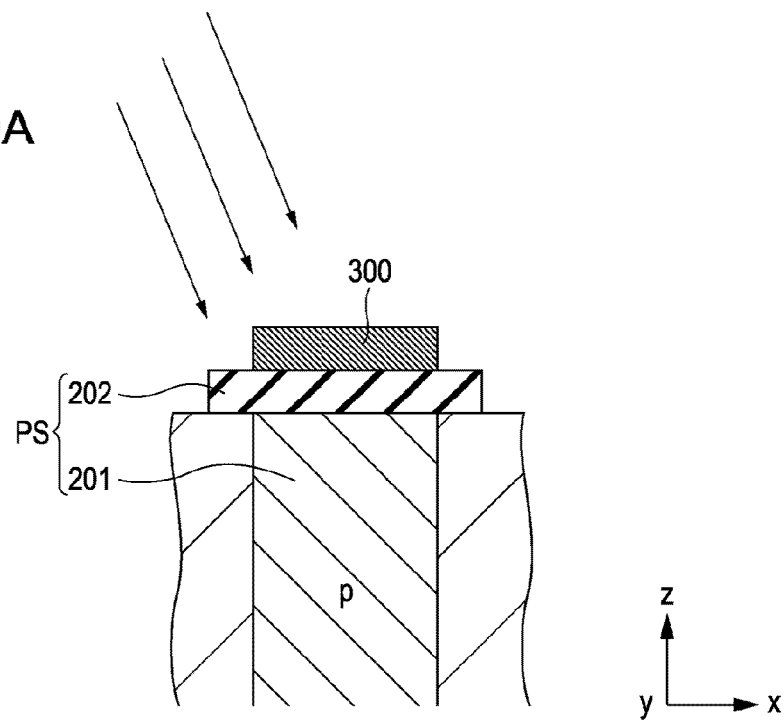
FIGS. 9A and 9B are diagrams illustrating magnified parts where a light shielding portion is arranged according to the first embodiment of the present invention.
Figure 9B:
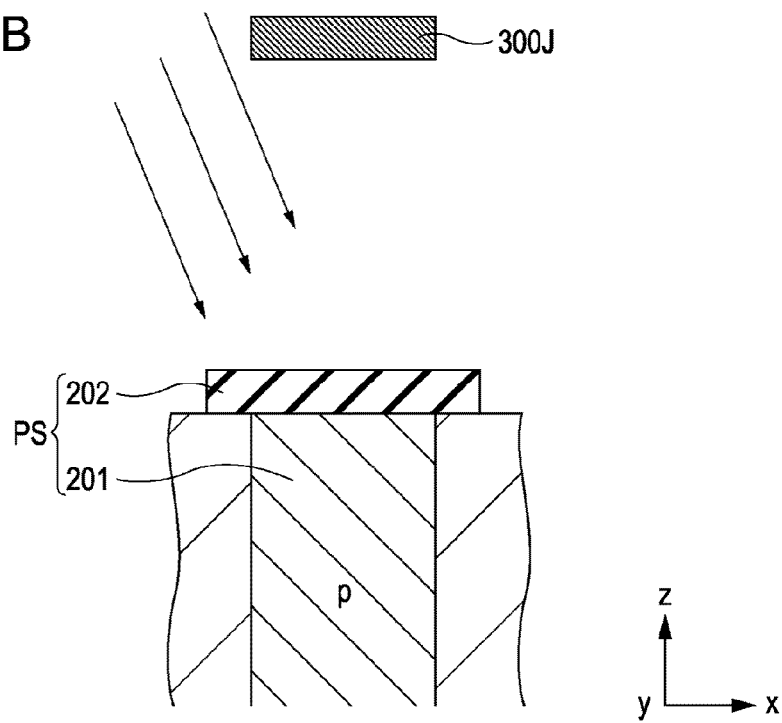

FIGS. 9A and 9B are diagrams illustrating magnified parts where a light shielding portion 300 is arranged according to the first embodiment of the present invention. The FIG. 9A illustrates incident light entering the element isolation portion PS in the embodiment. On the other hand, unlike the embodiment, the FIG. 9B illustrates incident light entering the element isolation portion PS in the case in which a light shielding portion 300J is arranged away from the insulation layer 202.

As shown in FIG. 9A, in the embodiment, the light shielding portion 300 can effectively stop, at the upper surface of the insulation layer 202, the incident light from entering the impurity diffusion region 201. On the other hand, as shown in FIG. 9B, in the case in which the light shielding portion 300J is arranged away from the insulation layer 202, the incident light enters the upper surface of the insulation layer 202 from between the light shielding portion 300J and the insulation layer 202. Therefore, it is difficult to effectively stop the incident light from entering the impurity diffusion region 201.

Accordingly, in the embodiment, since a dark current can be prevented from occurring in the impurity diffusion region, the image quality of captured images can be improved.

Accordingly, in the embodiment, while the image quality of captured images can be improved, fabrication yield can also be improved.

In addition, in the embodiment, the light shielding portion 300 is formed using polysilicon. The polysilicon has a higher light absorption coefficient than other material, with respect to short-wavelength light. The case in which the light shielding portion 300 is formed using silicide, polycide, or salicide is no different from the case in which the light shielding portion 300 is formed using polysilicon. Therefore, in the embodiment, the advantage mentioned above is achieved more effectively.

2. Second Embodiment (A) Device Configuration etc.

Figure 10:
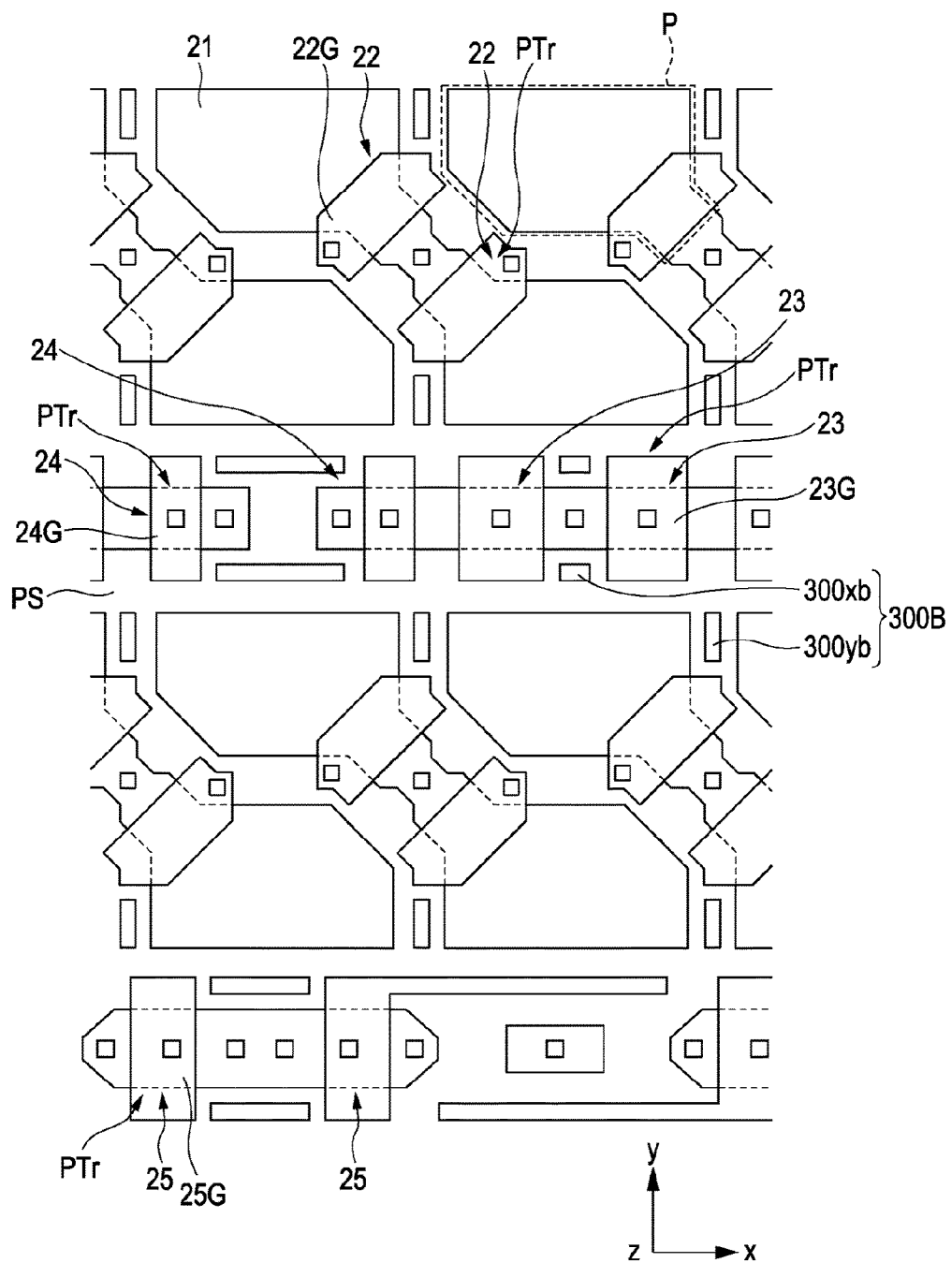
FIG. 10 is a diagram illustrating a main part of a solid-state imaging device according to a second embodiment of the present invention.

FIG. 10 is a diagram illustrating a main part of a solid-state imaging device 1b according to a second embodiment of the present invention.

Here, in the same way as FIG. 3, FIG. 10 illustrates a magnified part of the upper surface of the imaging region PA.

As shown in FIG. 10, in the embodiment, a light shielding portion 300B is different from that of the first embodiment. Other than this point, the embodiment is no different from the first embodiment. Therefore, description regarding an overlap between the first and second embodiments will be omitted.

As shown in FIG. 10, the light shielding portion 300B is formed in the element isolation portion PS in the same way as in the first embodiment. In addition, the light shielding portion 300B includes a portion 300xb extending in the horizontal direction x and a portion 300yb extending in the vertical direction y. Then, in the same way as in the first embodiment, the individual extending portions 300xb and 300yb are formed in the same layer as the individual gate electrodes 22G, 23G, 24G, and 25G.

However, as shown in FIG. 10 in the embodiment, unlike the first embodiment, the individual extending portions 300xb and 300yb are not formed so as to be integrated with the individual gate electrodes 22G, 23G, 24G, and 25G. Namely, the individual extending portions 300xb and 300yb are patterned so as to be isolated from the individual gate electrodes 22G, 23G, 24G, and 25G.

In the same way as in the first embodiment, by patterning the polysilicon layer 400 (refer to FIG. 8), the light shielding portion 300B and the individual gate electrodes 22G, 23G, 24G, and 25G are simultaneously formed.

(B) Summary

As mentioned above, in the embodiment, the light shielding portion 300B and the individual gate electrodes 22G, 23G, 24G, and 25G are simultaneously formed in the same way as in the first embodiment. In addition, in the embodiment, in the same way as in the first embodiment, the light shielding portion 300B is directly arranged on the upper surface of the insulation layer 202 included in the element isolation portion PS.

Accordingly, in the embodiment, in the same way as in the first embodiment, while the image quality of captured images can be improved, fabrication yield can be improved.

3. Third Embodiment (A) Device Configuration

Figure 11:
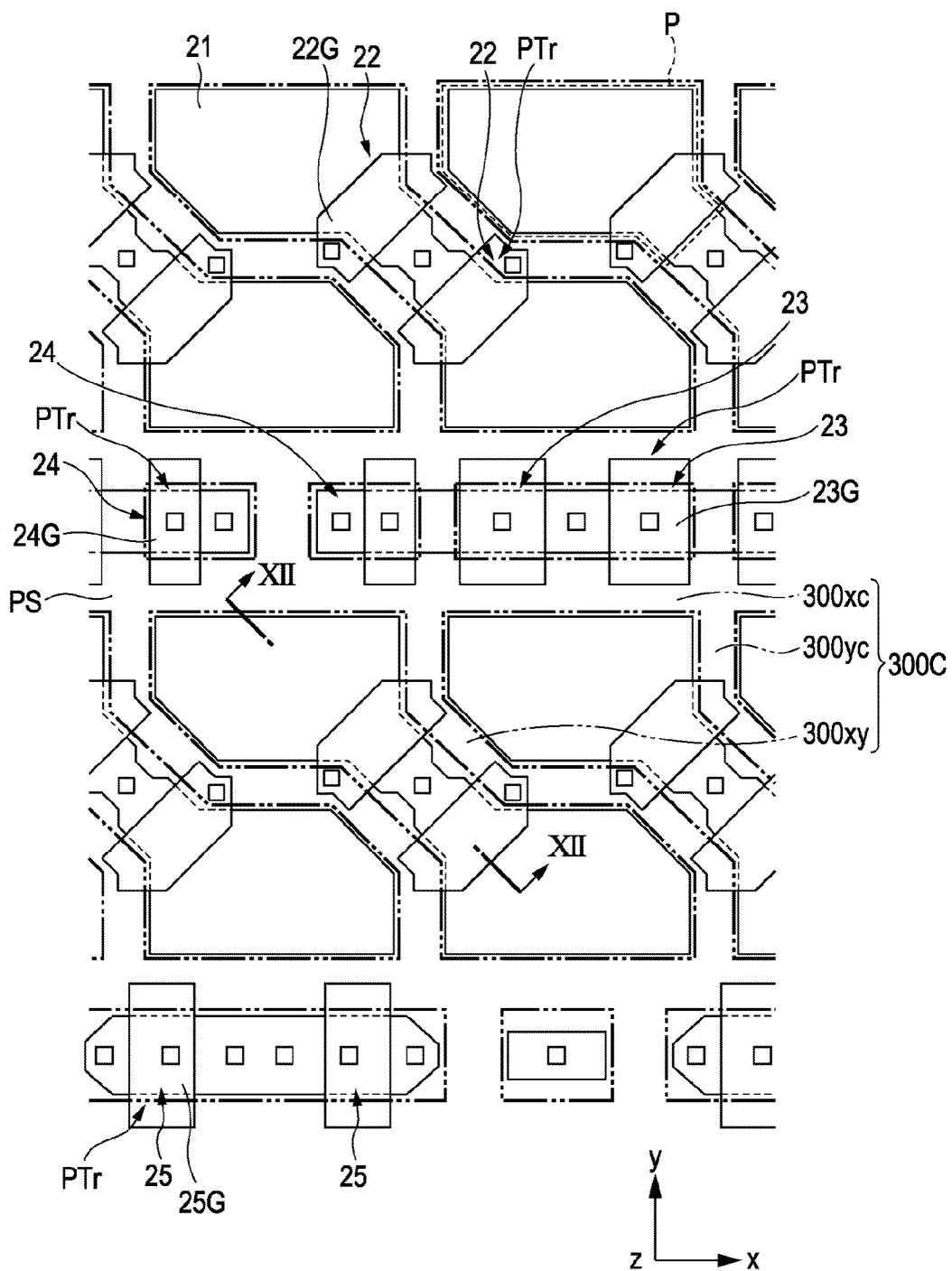
FIG. 11 is a diagram illustrating a main part of a solid-state imaging device according to a third embodiment of the present invention.

FIG. 11 is a diagram illustrating a main part of a solid-state imaging device 1c according to a third embodiment of the present invention.

Here, in the same way as FIG. 3, FIG. 11 illustrates a magnified part of the upper surface of the imaging region PA. In FIG. 11, two-dot chain lines mean that portions outlined with the two-dot chain lines are located in a higher layer than portions outlined with solid lines.

As shown in FIG. 11, in the embodiment, a light shielding portion 300C is different from that of the first embodiment. Other than this point, the embodiment is no different from the first embodiment. Therefore, description regarding an overlap between the first and third embodiments will be omitted.

As shown in FIG. 11, the light shielding portion 300C is formed in the element isolation portion PS in the same way as in the first embodiment. In addition, the light shielding portion 300C includes a portion 300xc extending in the horizontal direction x and a portion 300yc extending in the vertical direction y.

However, in the embodiment, unlike the first embodiment, the light shielding portion 300C is not formed in the same layer as the individual gate electrodes 22G, 23G, 24G, and 25G. Then, the light shielding portion 300C is formed as a layer different from a layer where the individual gate electrodes 22G, 23G, 24G, and 25G are formed.

In addition, the light shielding portion 300C further includes a portion 300xy extending in an oblique direction with respect to both the horizontal direction x and the vertical direction y, and is formed so that the individual extending portions 300xc, 300yc, and 300xy correspond to the planar shape of the element isolation portion PS.

Specifically, the individual extending portions 300xc, 300yc, and 300xy in the light shielding portion 300C are formed so as to be located around the periphery of the photodiode 21 on the imaging surface (xy surface).

In addition, the individual extending portions 300xc, 300yc, and 300xy in the light shielding portion 300C are formed so as to be located around the individual peripheries of the transfer transistor 22, the amplification transistor 23, the selection transistor 24, and the reset transistor 25.

In addition, above the transfer transistor 22, the amplification transistor 23, the selection transistor 24, and the reset transistor 25, the light shielding portion 300C is formed so as to coat other portion than a portion where a contact electrically connected to an electrode is arranged. For example, the light shielding portion 300C is formed so as to coat the upper side of a portion where the gate electrodes 22G, 23G, 24G, and 25G of the transistors 22, 23, 24, and 25 extend to on the element isolation portion PS from the channel forming region. In addition, the light shielding portion 300C is formed so as to coat the upper side of the source and drain regions of the amplification transistor 23 and the selection transistor 24. In this portion, the light shielding portion 300C is formed so that an interlayer insulation layer (not shown) is interposed between a terminal portion including the gate electrodes 22G, 23G, 24G, and 25G and the light shielding portion 300C.

(B) Manufacturing Method

The main part of a manufacturing method for manufacturing the solid-state imaging device 1c will be described hereinafter.

FIGS. 12A and 12B are diagrams illustrating main parts arranged in individual processes in the method for manufacturing the solid-state imaging device 1c according to the third embodiment of the present invention. Here, FIGS. 12A and 12B illustrate the cross-sections of the imaging region PA in the same way as FIG. 4.

(B-1) Formation of Gate Electrode (22G etc.)

After the polysilicon layer 400 is formed as shown in FIG. 8 in the first embodiment, a gate electrode (22G or the like) is formed as shown in FIG. 12A.

Here, in the same way as in the first embodiment, by patterning the polysilicon layer 400 shown in FIG. 8, the gate electrodes 22G, 23G, 24G, and 25G are formed as shown in FIG. 11.

Namely, in the process, the polysilicon layer 400 is not patterned to the light shielding portion 300C.

After that, in the same way as in the first embodiment, the source and drain regions of the individual pixel transistors PTr (floating diffusion regions FDs are included) are formed. In this way, the pixel transistors PTr are formed.

In addition, an interlayer insulation layer (not shown) is formed on the surface of the substrate 101 so as to coat individual portions.

(B-2) Formation of Light Shielding Portion 300C

Next, as shown in FIG. 12B, the light shielding portion 300C is formed.

Here, in the same way as mentioned above, after, for example, a polysilicon layer (not shown) is formed so as to coat a region including a portion where the light shielding portion 300C is formed, the light shielding portion 300C is formed by subjecting the polysilicon layer (not shown) to a patterning process.

In this way, as shown in FIGS. 12A and 12B, the light shielding portion 300C is formed, in cross-section, on the surface of the insulation layer 202 included in the element isolation portion PS.

In addition, as shown in FIG. 11, regarding the planar shape of the shielding portion 300C, the extending portions 300xc, 300yc, and 300xy are formed so as to correspond to the element isolation portion PS.

After that, portions, such as a wiring layer (not shown) and on-chip lenses or the like, are formed and hence the solid-state imaging device 1c is completed.

(C) Summary

As mentioned above, according to the embodiment, the light shielding portion 300C is formed so as to include portions extending according to the planar shape of the element isolation portion PS arranged on the imaging surface (xy surface). In addition, in the embodiment, in the same way as in the first embodiment, the light shielding portion 300C is directly arranged on the upper surface of the insulation layer 202 included in the element isolation portion PS.

Accordingly, in the embodiment, in the same way as in the first embodiment, while the image quality of captured images can be improved, fabrication yield can also be improved.

4. Other Issues

Embodiments of the invention are not limited to the embodiments mentioned above, and various modified embodiments can be adopted as those of the invention.

For example, other structures than the structures illustrated in the embodiments mentioned above may be applied to the element isolation portion according to an embodiment of the invention.

Figure 13A:
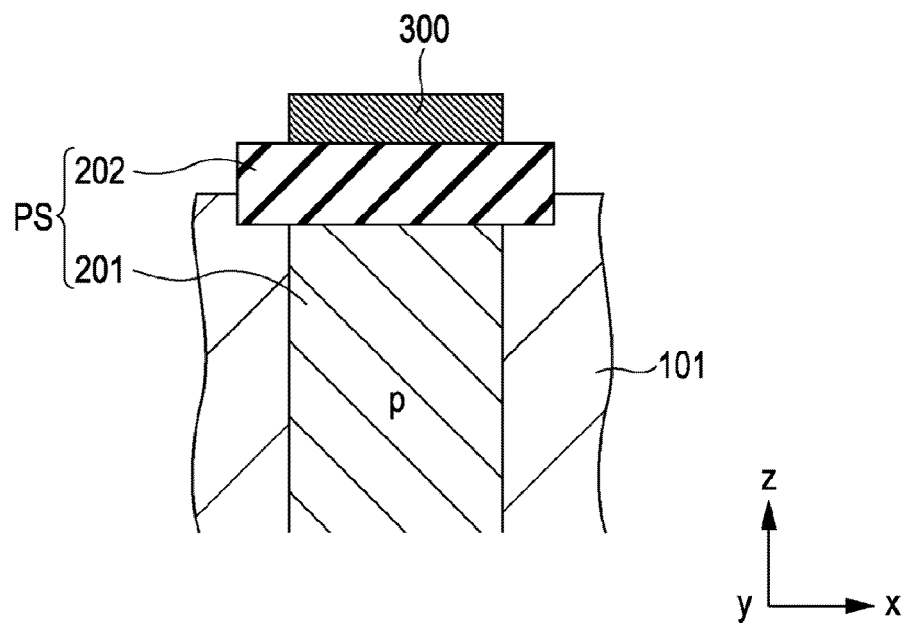
FIGS. 13A and 13B are diagrams illustrating modified examples of an element isolation portion according to an embodiment of the present invention.
Figure 13B:
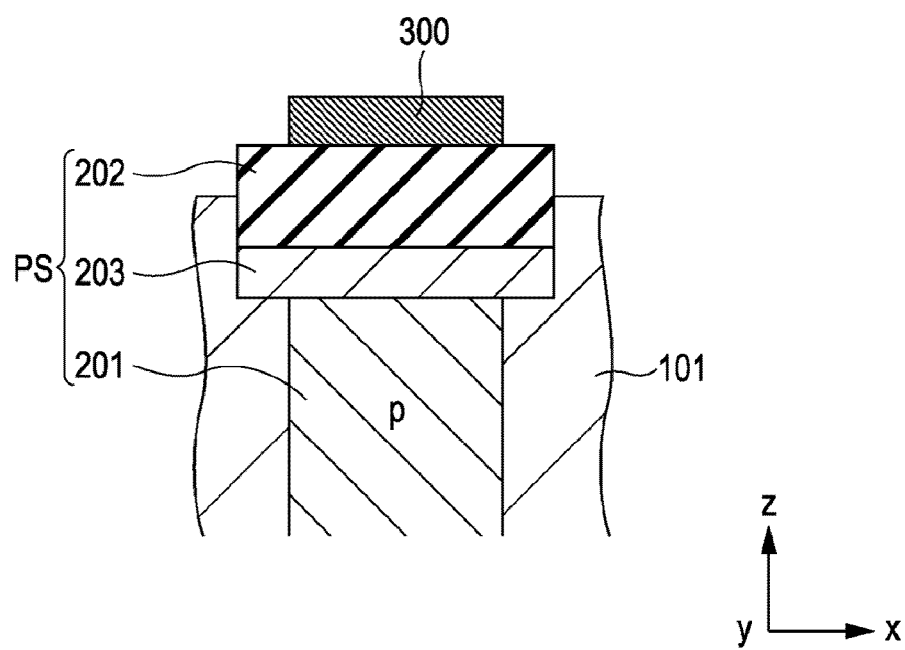
Figure 14:
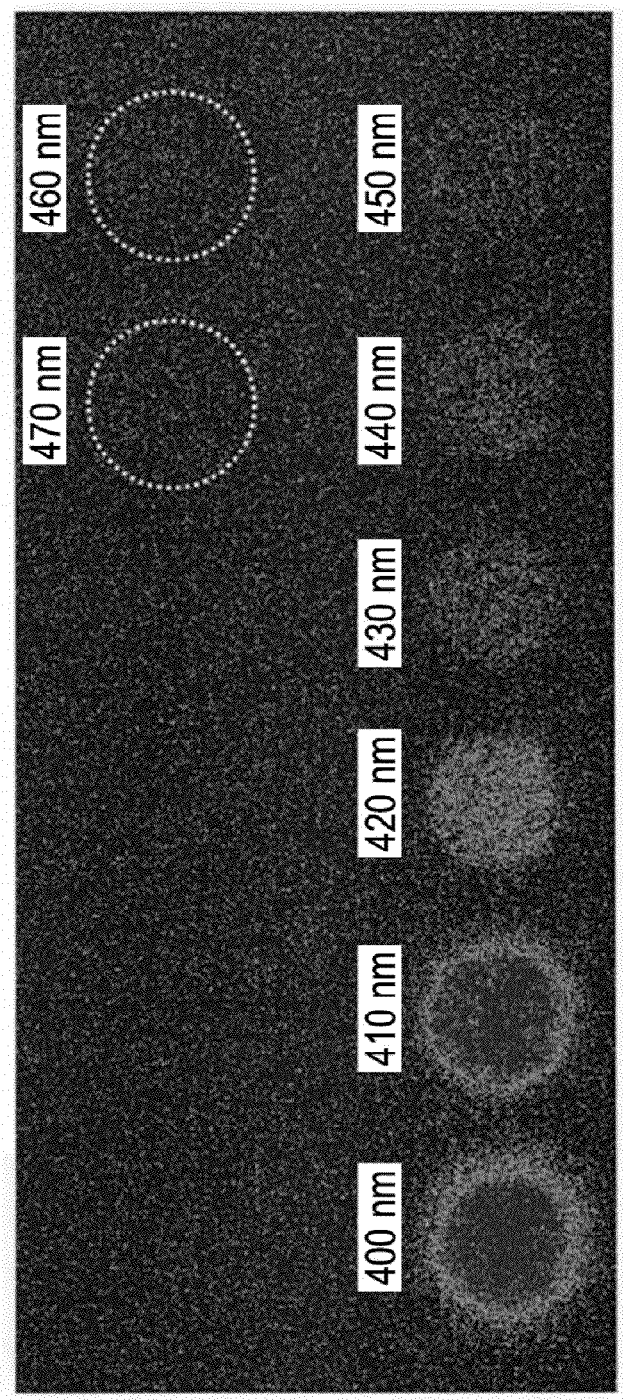
FIG. 14 is a diagram illustrating the relation between the wavelength of incident light and the occurrence of a dark current.

FIGS. 13A and 13B are diagrams illustrating modified examples of an element isolation portion PS according to an embodiment of the present invention.

As shown in FIG. 13A, in the case in which an insulation layer 202S included in the element isolation portion PS is arranged so as to be embedded in part in the substrate 101, the light shielding portion 300 may be formed on the upper surface of the insulation layer 202S (refer to Japanese Unexamined Patent Application Publication No. 2006-93319 etc.).

As shown in FIG. 13B, in addition to the impurity diffusion region 201, an impurity diffusion region 203 may also be formed on the lower surface of the insulation layer 202S. In this case, the impurity diffusion region 203 may be formed with a width similar to that of the insulation layer 202S (refer to Japanese Unexamined Patent Application Publication No. 2006-93319 etc.).

In addition, while, in the embodiments mentioned above, the case in which the embodiments are applied to the camera is described, embodiments of the invention are not limited to the case. Embodiments of the invention may be applied to other electronic devices, such as a scanner and a copy machine, including solid-state imaging devices.

In addition, in the embodiments mentioned above, while the case in which the embodiments are applied to the case in which a plurality of photodiodes share a pixel transistor or the like is described, embodiments of the invention are not limited to the case. Embodiments of the invention may be applied to the case in which a set of pixel transistors is arranged for each of the photodiodes.

While, as mentioned above, the structure in which a pair of the photodiodes shares one floating diffusion region is described, embodiments of the invention are not limited to the structure. Embodiments of the invention may be applied to the case in which more than two photodiodes share one floating diffusion region.

In addition, while the case in which four types of transistors, namely, the transfer transistor, the amplification transistor, the selection transistor, and the reset transistor, are arranged as the pixel transistor is described, embodiments of the invention are not limited to the case.

In addition, the solid-state imaging devices 1, 1b, and 1c in the embodiments mentioned above correspond to a solid-state imaging device according to an embodiment of the present invention. In addition, the photodiodes 21 in the embodiments mentioned above correspond to a photoelectric conversion element according to an embodiment of the present invention. In addition, the transfer transistors 22 in the embodiments mentioned above correspond to a transfer transistor according to an embodiment of the present invention. In addition, the gate electrodes 22G, 23G, 24G, and 25G in the embodiments mentioned above correspond to a gate electrode according to an embodiment of the present invention. In addition, the amplification transistors 23 in the embodiments mentioned above correspond to an amplification transistor according to an embodiment of the present invention. In addition, the selection transistors 24 in the embodiments mentioned above correspond to an amplification transistor according to an embodiment of the present invention. In addition, the reset transistors 25 in the embodiments mentioned above correspond to a reset transistor according to an embodiment of the present invention. In addition, the cameras 40 in the embodiments mentioned above correspond to an electronic device according to an embodiment of the present invention. In addition, the substrates 101 in the embodiments mentioned above correspond to a semiconductor substrate according to an embodiment of the present invention. In addition, the impurity diffusion regions 201 and 203 in the embodiments mentioned above correspond to an impurity diffusion region according to an embodiment of the present invention. In addition, the insulation layers 202 in the embodiments mentioned above correspond to an insulation layer according to an embodiment of the present invention. In addition, the light shielding portions 300, 300B, and 300C in the embodiments mentioned above correspond to a light shielding portion according to an embodiment of the present invention. In addition, the polysilicon layers 400 in the embodiments mentioned above correspond to a conductive layer according to an embodiment of the present invention. In addition, the floating diffusion regions FDs in the embodiments mentioned above correspond to a floating diffusion region according to an embodiment of the present invention. In addition, the element isolation portions PS in the embodiments mentioned above correspond to an element isolation portion according to an embodiment of the present invention. In addition, the pixel transistors PTr in the embodiments mentioned above correspond to a pixel transistor according to an embodiment of the present invention. In addition, the imaging surfaces Ps in the embodiments mentioned above correspond to an imaging surface according to an embodiment of the present invention.

The present application contains subject matter related to that disclosed in Japanese Priority Patent Application JP 2009-179680 filed in the Japan Patent Office on Jul. 31, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a solid-state imaging device, the method comprising the steps of:
    forming a plurality of photoelectric conversion portions at the imaging surface of a semiconductor substrate;
    forming an impurity diffusion region among the plurality of photoelectric conversion portions, the impurity diffusion region functioning as an element isolation portion configured to isolate the plurality of photoelectric conversion portions on the imaging surface and to isolate groups of photoelectric conversion portions from each other;
    forming a light shielding portion above the element isolation portion, the light shielding portion being configured to stop incident light from entering the element isolation portion on the imaging surface;
    forming the gate electrodes of a plurality of pixel transistors on the imaging surface, the plurality of pixel transistors being configured to read out and output signal charge, generated in the plurality of photoelectric conversion portions, as data signals; and
    forming a conductive layer before the light shielding portion forming step and the gate electrode forming step are performed, the conductive layer being formed by forming the layer of a conductive material having a light blocking effect so that a region that includes a portion where the light shielding portion is formed and portions where the gate electrodes of the plurality of pixel transistors are formed is coated on the imaging surface,
    wherein,
    in the light shielding portion forming step and the gate electrode forming step, the light shielding portion and the gate electrodes are simultaneously formed by patterning the conductive layer.

2. The method for manufacturing a solid-state imaging device according to claim 1, wherein in the light shielding portion forming step, the light shielding portion is formed so as to include an extending portion of the light shielding portion among the plurality of photoelectric conversion portions.

3. The method for manufacturing a solid-state imaging device according to claim 2, wherein in the light shielding portion forming step and the gate electrode forming step, the light shielding portion and the gate electrodes are formed so that the light shielding portion and each of the gate electrodes are connected to each other.

4. The method for manufacturing a solid-state imaging device according to claim 3, wherein:
the element isolation portion forming step includes the step of forming an insulation layer so as to be located above the impurity diffusion region; and
in the light shielding portion forming step, the light shielding portion is formed so as to be in contact with the upper surface of the insulation layer.

5. The method for manufacturing a solid-state imaging device according to claim 4, wherein:
in the gate electrode forming step, the gate electrodes of transfer transistors are formed as the gate electrodes, the transfer transistors being configured to read out signal charge from the photoelectric conversion portions to a floating diffusion region; and
in the light shielding portion forming step, the light shielding portion is formed so as to be connected to the gate electrodes of the transfer transistors.

6. The method for manufacturing a solid-state imaging device according to claim 5, wherein:
in the gate electrode forming step, the gate electrodes of amplification transistors are formed as the gate electrodes, the amplification transistors being configured to be electrically connected to the floating diffusion region; and
in the light shielding portion forming step, the light shielding portion is formed so as to be connected to the gate electrodes of the amplification transistors.

7. The method for manufacturing a solid-state imaging device according to claim 6, wherein:
in the gate electrode forming step, the gate electrodes of selection transistors are formed as the gate electrodes; and
in the light shielding portion forming step, the light shielding portion is formed so as to be connected to the gate electrodes of the selection transistors.

8. The method for manufacturing a solid-state imaging device according to claim 7, wherein:
in the gate electrode forming step, the gate electrodes of reset transistors are formed as the gate electrodes; and
in the light shielding portion forming step, the light shielding portion is formed so as to be connected to the gate electrodes of the reset transistors.

9. The method for manufacturing a solid-state imaging device according to claim 2, wherein in the light shielding portion forming step and the gate electrode forming step, the light shielding portion and the gate electrodes are formed so that the light shielding portion and each of the gate electrodes are isolated from each other.

10. The method for manufacturing a solid-state imaging device according to any one of claims 1 to 9, wherein in the conductive layer forming step, a polysilicon layer is formed as the conductive layer.

11. A method for manufacturing a solid-state imaging device, the method comprising the steps of:
forming a plurality of photoelectric conversion portions on the imaging surface of a semiconductor substrate;
forming an impurity diffusion region among the plurality of photoelectric conversion portions, the impurity diffusion region functioning as an element isolation portion configured to isolate the plurality of photoelectric conversion portions at the imaging surface and to isolate groups of photoelectric conversion portions from each other; and
forming a light shielding portion above the element isolation portion, the light shielding portion being configured to stop incident light from entering the element isolation portion on the imaging surface,
wherein,
in the light shielding portion forming step, the light shielding portion is formed so that the light shielding portion includes a portion extending according to the planar shape of the element isolation portion formed on the imaging surface.

12. A solid-state imaging device comprising:
a plurality of photoelectric conversion portions at the imaging surface of a semiconductor substrate;
an element isolation portion in which an impurity diffusion region is formed so as to isolate the plurality of photoelectric conversion portions at the imaging surface and to isolate groups of photoelectric conversion portions from each other;
a light shielding portion configured to stop incident light from entering the element isolation portion on the imaging surface; and
a plurality of pixel transistors on the imaging surface and configured to read out and output signal charge, generated in the plurality of photoelectric conversion portions, as data signals,
wherein,
the light shielding portion includes an extending portion extending among the plurality of photoelectric conversion portions and is formed so that the extending portion of the light shielding portion and each of the gate electrodes of the pixel transistor are connected to each other.

13. The solid-state imaging device according to claim 12, wherein the gate electrodes of the pixel transistors and the light shielding portion are formed using polysilicon.

14. An electronic apparatus comprising:
a plurality of photoelectric conversion portions at the imaging surface of a semiconductor substrate;
an element isolation portion in which an impurity diffusion region is formed so as to isolate the plurality of photoelectric conversion portions at the imaging surface and to isolate groups of photoelectric conversion portions from each other;
a light shielding portion configured to stop incident light from entering the element isolation portion on the imaging surface; and
a plurality of pixel transistors on the imaging surface and configured to read out and output signal charge, generated in the plurality of photoelectric conversion portions, as data signals;
wherein,
the light shielding portion includes an extending portion extending among the plurality of photoelectric conversion portions and is formed so that the extending portion of the light shielding portion and each of the gate electrodes of the pixel transistor are connected to each other.

* * * * *